US009494338B2

(12) United States Patent
Ishida et al.

(10) Patent No.: US 9,494,338 B2
(45) Date of Patent: Nov. 15, 2016

(54) SOLAR LIGHT COLLECTING MIRROR AND SOLAR THERMAL POWER GENERATION SYSTEM HAVING SOLAR LIGHT COLLECTING MIRROR

(75) Inventors: Kazuo Ishida, Hachioji (JP); Yutaka Takahashi, Hino (JP)

(73) Assignee: KONICA MINOLTA, INC., Tokyo (JP)

(*) Notice: Subject to any disclaimer, the term of this patent is extended or adjusted under 35 U.S.C. 154(b) by 523 days.

(21) Appl. No.: 14/128,475

(22) PCT Filed: Jun. 12, 2012

(86) PCT No.: PCT/JP2012/064963
§ 371 (c)(1),
(2), (4) Date: Dec. 20, 2013

(87) PCT Pub. No.: WO2012/176650
PCT Pub. Date: Dec. 27, 2012

(65) Prior Publication Data
US 2014/0158114 A1    Jun. 12, 2014

(30) Foreign Application Priority Data

Jun. 21, 2011   (JP) .................. 2011-137514

(51) Int. Cl.
*F24J 2/00*   (2014.01)
*F24J 2/10*   (2006.01)
(Continued)

(52) U.S. Cl.
CPC ............ *F24J 2/1057* (2013.01); *F03G 6/065* (2013.01); *F24J 2/07* (2013.01); *F24J 2/16* (2013.01); *F24J 2/18* (2013.01); *G02B 5/10* (2013.01); *G02B 7/182* (2013.01); *G02B 7/183* (2013.01); *G02B 26/0825* (2013.01); *H01L 31/0547* (2014.12); *Y02E 10/41* (2013.01); *Y02E 10/46* (2013.01); *Y02E 10/52* (2013.01)
(Continued)

(58) Field of Classification Search
CPC ............ F24J 2/00; F24J 2/1057; F24J 2/1052; G02B 5/10; F03G 6/00
(Continued)

(56) References Cited

U.S. PATENT DOCUMENTS 2,412,466 A * 12/1946 Miller, Jr. .................. C02F 1/14
                                                          126/624
3,906,927 A *  9/1975 Caplan .................. B32B 37/146
                                                          126/575
(Continued)

FOREIGN PATENT DOCUMENTS

JP       62-225852 A    10/1987
JP     2003-074988 A     3/2003
(Continued)

OTHER PUBLICATIONS

International Search Report (ISR) dated Aug. 14, 2012 (and English translation thereof) issued in International Application No. PCT/JP2012/064963.

*Primary Examiner* — Gregory Huson
*Assistant Examiner* — Nikhil Mashruwala
(74) *Attorney, Agent, or Firm* — Holtz, Holtz & Volek PC

(57) ABSTRACT

A solar light collecting mirror includes a reflective section which is elastically deformable, and a frame which is elastically deformable and configured to support the reflective section. A central portion of the reflective section is positionally fixed in X and Y directions of the reflective section. A relative position in a Z direction between the central portion of the reflective section and a peripheral portion of the reflective section is changeable. The peripheral portion of the reflective section is not positionally fixed in the X and Y directions. The frame includes warp members which radially extend from a position corresponding to the central portion of the reflective section. And the reflective section is configured to deform elastically together with the (Continued)

frame so as to change the relative position in the Z direction between the central portion and the peripheral portion, whereby a concave mirror structure is obtained.

18 Claims, 10 Drawing Sheets

(51) Int. Cl.
    *G02B 7/182*    (2006.01)
    *G02B 7/183*    (2006.01)
    *G02B 26/08*    (2006.01)
    *F24J 2/07*     (2006.01)
    *F24J 2/16*     (2006.01)
    *G02B 5/10*     (2006.01)
    *F24J 2/18*     (2006.01)
    *F03G 6/06*     (2006.01)
    *H01L 31/054*   (2014.01)

(58) Field of Classification Search
    USPC ............... 126/688, 694, 704, 696; 136/251; 359/847, 869; 350/608, 611
    See application file for complete search history.

(56) References Cited

U.S. PATENT DOCUMENTS

| | | | | |
|---|---|---|---|---|
| 4,033,476 A | * | 7/1977 | Greenquist | B65D 90/54 16/267 |
| 4,136,671 A | * | 1/1979 | Whiteford | F24J 2/145 126/654 |
| 4,552,438 A | * | 11/1985 | Murphy | F24J 2/1052 343/914 |
| 4,947,825 A | * | 8/1990 | Moriarty | B64G 1/446 126/635 |
| 5,365,920 A | * | 11/1994 | Lechner | F24J 2/145 126/600 |
| 6,217,178 B1 | * | 4/2001 | Drumheller | F24J 2/1057 359/849 |
| 7,374,301 B1 | * | 5/2008 | Simmers | G02B 5/10 359/846 |
| 9,006,560 B2 | * | 4/2015 | Shelef | F24J 2/07 126/600 |
| 9,322,576 B2 | * | 4/2016 | Couturier | F24J 2/07 |
| 2010/0258187 A1 | | 10/2010 | Mori et al. | |
| 2011/0073104 A1 | * | 3/2011 | Dopp | F24J 2/055 126/651 |
| 2011/0180057 A1 | * | 7/2011 | Page | F24J 2/1052 126/600 |
| 2012/0314315 A1 | * | 12/2012 | Yoshimura | F24J 2/10 359/853 |
| 2013/0327371 A1 | * | 12/2013 | Hui | H01L 31/045 136/245 |
| 2015/0007516 A1 | * | 1/2015 | Glick | E04B 2/7425 52/275 |

FOREIGN PATENT DOCUMENTS

| | | |
|---|---|---|
| JP | 2003-124741 A | 4/2003 |
| JP | 2005-156749 A | 6/2005 |
| JP | 2009-218383 A | 9/2009 |
| WO | WO 2009/057551 A1 | 5/2009 |

* cited by examiner

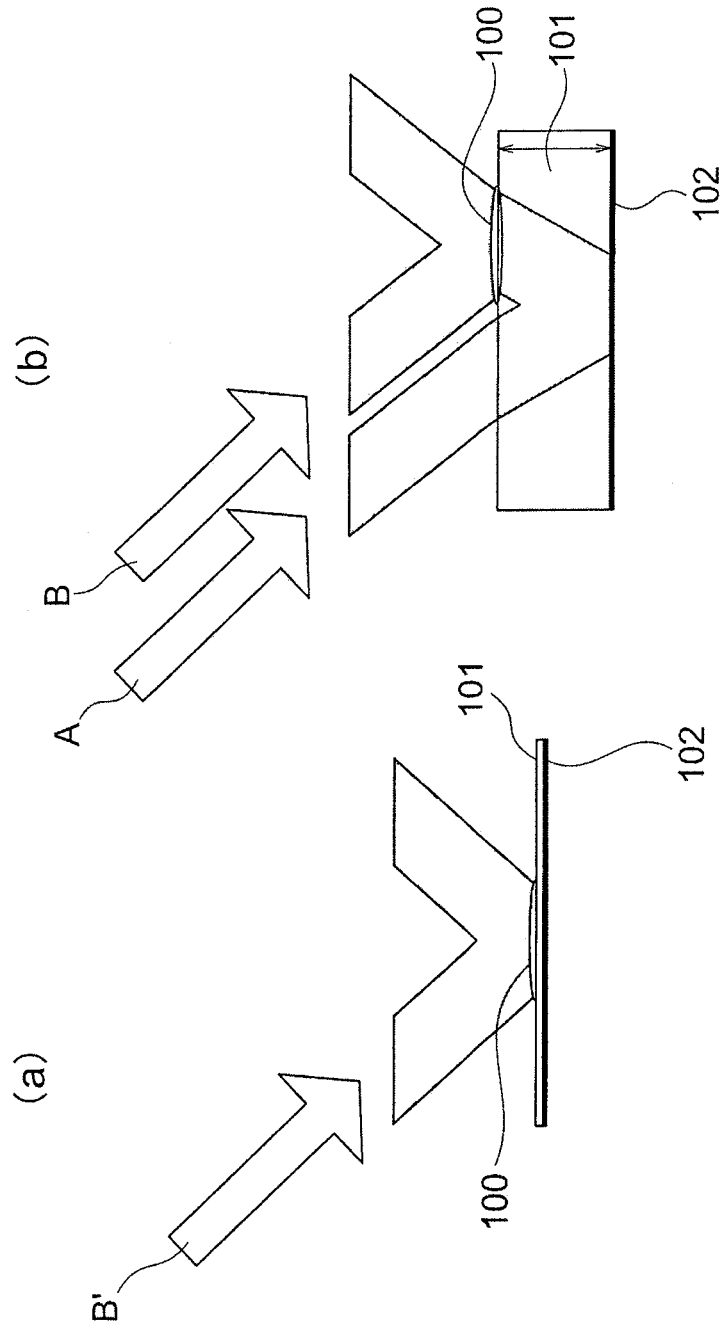

SOLAR LIGHT COLLECTING MIRROR AND SOLAR THERMAL POWER GENERATION SYSTEM HAVING SOLAR LIGHT COLLECTING MIRROR

TECHNICAL FIELD

The present invention relates to a solar light collecting mirror and the solar thermal power generation system which employs it.

BACKGROUND ART

In recent years, natural energies, such as biomass energy, nuclear energy, wind-force energy, and solar energy have been currently studied as alternative energies for fossil fuel energies, such as oil and natural gas. Among these alternative energies for fossil fuel energies, the utilization of solar energy is considered as being prosperous as the most stable and voluminous natural energy. However, although the solar energy is a remarkably dominant alternative energy, the following points may be considered to become problems from the viewpoints of utilization of it. (1) The energy density of the solar energy is low, and (2) it is difficult to storage and transport the solar energy.

For the above problems of the solar energy, in order to solve the problem of the low energy density of the solar energy, a method of collecting the solar energy by a large-scaled reflecting apparatus has been proposed. As one of such a solar thermal power generation system, for example, PTL 1 describes a tower type solar thermal power generation system. This system includes a plurality of reflective mirrors arranged in the form of an approximately circle or an approximately fun and a tower installed in the central portion, and the system is configured to collect light by concentrating solar light rays via the reflective mirror into a heat collecting section disposed in the tower and to generate electric power by utilizing the heat of the collected light.

Here, as with the tower type solar thermal power generation system, in solar thermal power generation systems in which the distance from reflective mirrors to a heat collecting section is so long from some tens of meters to some hundreds of meters, light collection efficiency has not yet been sufficient, and further improvement is still required for the light collection efficiency. Hereinafter, this point will be described in detail.

Solar light rays are not perfect parallel light rays and are light rays with an inclination within an angle corresponding to a view angle of 0.52 to 0.54. In the case where the distance from a reflective mirror to a heat collecting section is as short as several meters, this view angle of the solar light rays may be almost disregarded. However, as with the tower type solar thermal power generation system, in the case where the distance from a reflective mirror to a heat collecting section becomes long, if the reflective mirror is a flat mirror, there are the following problems. When solar light rays are reflected on the flat mirror, among the reflected light rays of the solar light rays, light rays of a light-ray component corresponding to the view angle diffuse in proportion to the light collecting distance. Accordingly, the limited light receiving area of the heat collecting section cannot receive all of the reflected light rays, which results in that the light collection efficiency lowers.

In order to solve the above problems, PTL 1 describes the structure that as shown in FIG. 6, a pseudo concave mirror is configured by combining a plurality of flat mirrors. However, such a pseudo concave mirror is not sufficient from the viewpoint of light collection efficiency.

Further, in order to acquire a concave mirror from curves surfaces without combining the flat mirrors, a complicated manufacture process is needed. Accordingly, it has been difficult to produce such a concave mirror in a simple manner at low cost. In particular, in the case of using concave mirrors for the tower type solar thermal power generation system, it is required to change the curvature of a concave mirror in accordance with the distance from the heat collecting section to the concave mirror. It may be more difficult to produce such concave mirrors with various curvatures at low cost. As a result, the solar thermal power generation system including a plurality of such concave mirrors with various curvatures naturally becomes high cost.

Then, as with the tower type solar thermal power generation system, in a solar thermal power generation system in which the distance from a reflective mirror to a heat collecting section becomes so long from some tens of meters to some hundreds of meters, it is requested to realize a solar light collecting mirror which can obtain high light collection efficiency, can be produced easily at low cost, and enables to obtain concave mirrors with various curvatures easily.

CITATION LIST

Patent Literature

PTL 1: Japanese Unexamined Patent Publication No. 2009-218383

SUMMARY OF INVENTION

Technical Problem

The present invention has been achieved in view of the above-mentioned problems, and an object of the present invention is to provide a solar light collecting mirror which can obtain light colleting efficiency, can be produced easily at low cost, and enables to obtain concave mirrors with various curvatures easily; and to provide a solar thermal power generation system employing the solar light collecting mirror; even in a solar thermal power generation system in which a distance from a reflective mirror to a heat collecting device becomes so long from some tens of meters to some hundreds of meters as with the tower type solar thermal power generation system.

Solution to Problem

The present invention described in claim 1 is a solar light collecting mirror is characterized in including a reflective section being elastically deformable, and a frame being elastically deformable and configured to support the reflective section, and in that:

a central portion of the reflective section is positionally fixed in an X direction and a Y direction of the reflective section, a relative position in a Z direction between the central portion of the reflective section and a peripheral portion of the reflective section is changeable, the peripheral portion of the reflective section is not positionally fixed in the X direction and the Y direction, the frame includes warp members which radially extend from a position corresponding to the central portion of the reflective section, and the reflective section is configured to deform elastically together with the frame so as to change the relative position in the Z direction between the central portion and the peripheral portion, whereby a concave mirror structure is obtained.

As a result of diligent studies, the present inventor found out that a concave mirror with a curved surface can be easily obtained by utilizing elastic deformation of a reflective section used as a mirror and a frame supporting the reflective section. In particular, the present inventor found out the following points. The frame supporting the reflective section is made to elastically deform so as to change the relative position in the Z direction between the central portion and the peripheral portion of the reflective section, whereby a concave mirror structure can be obtained. With this, since it becomes easy to obtain a concave mirror composed of a curved surface shaped in an approximately paraboloidal surface, not a simple curve, even if the distance from the reflective section to a heat collecting section is a long distance, remarkably-high light collecting efficiency can be obtained.

At this time, although the central portion (preferably, it conforms to the central portion of the frame) of the reflective section is positionally fixed in the X direction and the Y direction, the peripheral portion of the reflective section is not positionally fixed in the X direction and the Y direction. Accordingly, when the relative position in the Z direction between the central portion and the peripheral portion is changed, since the peripheral portion has a certain degree of freedom in terms of position, the peripheral portion can move relatively, that is, the peripheral portion can shift. Therefore, when the frame supporting the reflective section is elastically deformed so as to form a concave mirror, excessive stress is not caused on the peripheral portion so that the distortion of the concave mirror on the peripheral portion can be minimized. By minimizing the distortion of the mirror on the peripheral portion, mainly the following two merits can be enjoyed.

The first merit is in the point that since the distortion of the concave mirror on the peripheral portion can be minimized, the lowering of the light collecting efficiency on the peripheral portion is not likely to occur, which contributes to further improvement of the light collecting efficiency.

The second merit will be described below in detail. Since the solar light collecting mirror is used outdoors, the solar light collecting mirror is exposed to heat and ultraviolet rays derived from solar light, rainstorm, and sandstorm. Accordingly, there are problems that if distortion takes place on the peripheral portion of a concave mirror, the degradation of the concave mirror will be advanced around the distorted portion acting as the center of the degradation due to external environment. However, by minimizing the distortion of the concave mirror on the peripheral portion, regardless of the use at the outdoors, it becomes possible to maintain the functions of the solar light collecting mirror for a long term.

In the case where both the peripheral portion and the central portion are positionally fixed in the X direction and the Y direction and a concave mirror is formed by changing only the relative position in the Z direction, distortion takes place on the peripheral portion. Accordingly, it is said that the case where the peripheral portion is not positionally fixed in the X direction and the Y direction is superior in the points of the light collecting efficiency and service life time. For example, in the case where a mirror is made to deform into a concave mirror by a change of atmospheric pressure, it is necessary to keep an airtight state by bringing the peripheral portion of a frame supporting a reflective section in close contact with the base board. Accordingly, since the peripheral portion is positionally fixed in the X direction and the Y direction, distortion may take place on the peripheral portion, which causes the above-mentioned problems.

In particular, in the case where the reflective section is made from a thin material with low rigidity as with a film mirror, even if a concave mirror can be formed by the elastic deformation of the thin material working as a single body, there is a possibility that the surface of the thin material may wave, which results in the lowering of the light collecting efficiency. In contrast, by fixing the elastically deformable frame to the back surface of the reflective section, when the reflective section and the frame are made elastically deform as one body, it becomes possible to refrain the waving of the reflective section effectively.

Further, the frame is lightweight as compared with a uniform thickness plate member. Accordingly, in the case of a large-sized solar light collecting mirror in which the diameter of an inscribed circle with a configuration that a refractive section is viewed from the perpendicular direction is 1 m or more, there is a merit, such as easy handling. Further, since the frame includes warp members extending radially from a position corresponding to the central portion of the reflective section, although the frame is lightweight as compared with a plate member, the frame can acquire the strength sufficient to support the reflective member. In addition, at the time of acquiring a concave mirror structure by making the reflective section elastically deform together with the frame and by changing the relative position in the Z direction between the central portion and the peripheral portion, it becomes possible to prevent the occurrence of undesirable stress on the frame, and to obtain a concave mirror structure which allows a frame to elastically deform in a concave form, has less distortion, and has a configuration preferable to collect solar light.

The solar light collecting mirror described in claim 2 in the invention described in claim 1 is characterized in that the reflective section is directly disposed on the frame. With this, the constitution of a solar light collecting mirror can be simplified.

The solar light collecting mirror described in claim 3 in the invention described in claim 1 is characterized in that the reflective section is disposed on the frame via a thin plate. With this, the configuration of the reflective section can be made closer to a paraboloidal surface regardless of the configuration of the frame.

The solar light collecting mirror described in claim 4 in the invention described in any one of claims 1 to 3 is characterized in that the frame is formed by a combination of a plurality of frame units. With this, even a large-sized frame can be formed at low cost, and storage, conveyance, and the like become easy.

The solar light collecting mirror described in claim 5 in the invention described in any one of claims 1 to 4 is characterized in that the frame includes woof members which connect the warp members to each other. With this, it becomes possible to increase the strength of the frame.

The solar light collecting mirror described in claim 6 in the invention described in claim 5 is characterized in that the woof members are arranged in the form of approximately concentric circles around the central portion of the reflective section. With this, even if the frame is made in a large scale, the configuration of the reflective portion can be deformed radially uniformly.

The solar light collecting mirror described in claim 7 in the invention described in any one of claims 1 to 6 is characterized in that on the supposition that the number of warp members extending radially from a position corresponding to the central portion is n (pieces) and the radius of the frame is L (m), the following conditional expression is satisfied.

$$6 \cdot L \leq n \leq 10 \cdot L \quad (1)$$

With the satisfaction of the above conditional expression, it becomes possible to make the frame lightweight while obtaining the frame with the strength sufficient to support the reflective portion.

The solar light collecting mirror described in claim 8 in the invention described in any one of claims 1 to 7 is characterized in that when the frame is made deform elastically, an amount of deflection of each portion of the frame at a position located radially with an equal distance from the central portion of the reflective section is equal to each other. With this, the configuration of the reflective section can be made closer to the paraboloidal surface.

The solar light collecting mirror described in claim 9, in the invention described in any one of claims 1 to 8, is characterized in that the solar light collecting mirror further includes a base board and a supporting structural member which is disposed between the base board and the frame, and is configured to come in contact, via three contact points or a ring-shaped contact line, with the peripheral portion of the frame so as to allow the frame to relatively move, and to regulate a height of the frame in the Z direction, wherein the central portion of the frame on which the reflective section is disposed or the supporting structural member is positionally changeable in the Z direction, and wherein by positionally changing the central portion of the frame or the supporting structural member in the Z direction, the peripheral portion of the frame on which the reflective section is formed is moved while coming in contact with the supporting structural member, whereby the frame on which the reflective section is formed is made elastically deform so that a concave mirror structure can be obtained.

According to the present invention, by providing the supporting structural member between the base board and the frame, the relative movement between the peripheral portion of the frame on which the reflective section is formed and the base board can be made easily, and the height in the Z direction of the peripheral portion of the frame on which the reflective section is formed can be regulated, whereby the concave mirror configuration of the reflective section caused by the elastic deformation of the frame can be secured with high precision.

The solar light collecting mirror described in claim 10, in the invention described in claim 9, is characterized in that the central portion of the frame on which the reflective section is formed is positionally changeable in the Z direction, wherein by positionally changing the central portion in the Z direction, the peripheral portion of the frame on which the reflective section is formed is moved while coming in contact with the supporting structural member, whereby the frame on which the reflective section is formed is made elastically deform so that a concave mirror structure can be obtained.

According to the present invention, by displacing the central portion of the frame in the Z direction, a concave mirror structure can be acquired easily, and the curvature of each of the many solar light collecting mirrors can be easily set up in accordance with the respective distances from the heat collecting section.

The solar light collecting mirror described in claim 11, in the invention described in claim 9 or 10, is characterized in that when the configuration of the supporting structural member is viewed from the Z direction, the configuration is shaped such that each portion of the supporting structural member is arranged with an equal distance from the central portion of the frame acting as a center.

With the above configuration of the supporting structural member, when the relative position in the Z direction between the central portion and the peripheral portion is changed, a good-looking concave curved surface with less distortion can be formed, and the light collecting efficiency can be improved. Accordingly, the above configuration is preferable.

The solar light collecting mirror described in claim 12, in the invention described in claim 11, is characterized in that when the configuration of the supporting structural member is viewed from the Z direction, the configuration of the supporting structural member is shaped in a ring with a center positioned at the central portion of the frame.

With the ring-shaped configuration of the supporting structural member, when the relative position in the Z direction between the central portion and the peripheral portion is changed, a good-looking concave curve with specifically less distortion can be formed, and the light collecting efficiency can be improved greatly. Accordingly, the above configuration is preferable.

The solar light collecting mirror described in claim 13, in the invention described in any one of claims 1 to 12, is characterized in that the reflective section is a film mirror.

The film mirrors are advantageous in the points of lightweight, easy handling, and cheap. Meanwhile, as compared with ordinary glass mirrors, they are inferior in flatness, and there is possibility that when they are used as a flat mirror, the light collecting efficiency may not be acquired sufficiently. However, as with the present invention, by pasting and fixing such a film mirror onto the surface of an elastically deformable frame, and by making the film mirror and the frame deform elastically as a single body so as to form a concave surface, even if the film mirror itself is inferior in flatness, the light collecting efficiency can be acquired sufficiently. Accordingly, while utilizing the advantages of the film mirror in the points of lightweight and cheap, the defect of the film mirror that the flatness is comparatively low can be supplemented by the present invention.

The solar light collecting mirror described in claim 14, in the invention described in any one of claims 1 to 12, is characterized in that the reflective section is a thin glass plate mirror.

As compared with a film mirror, the thin glass plate mirror is comparatively expensive. However, since the thin glass plate mirror itself has a certain amount of rigidity depending on its thickness, a concave mirror structure can be acquired by fixing the thin glass plate mirror onto the frame and elastically deforming it together with the frame.

The solar light collecting mirror described in claim 15, in the invention described in any one of claims 1 to 14, is characterized in that the solar light collecting mirror is a mirror for solar thermal power generation.

A solar thermal power generation system described in claim 16 is characterized by including at least one a heat collecting section and the solar light collecting mirror described in claim 15, wherein the solar light collecting mirror reflects solar light and irradiates the heat collecting section with the reflected solar light. With this, a cheap solar thermal power generation system can be formed.

The solar thermal power generation system described in claim 17, in the invention described in claim 16, is characterized in that a plurality of the solar light collecting mirrors are arranged around the heat collecting section, and the relative position in the Z direction between the central portion of the reflective section and the peripheral portion of the reflective section is set up in accordance with a distance from the heat collecting section to each of the plurality of the solar light collecting mirrors. By using the solar light collecting mirrors of the present invention, the curvature of each of the solar light collecting mirrors can be easily set up by being matched with the corresponding distance from the heat collecting section. Accordingly, the adjustment becomes easy.

The solar thermal power generation system described in claim 18, in the invention described in claim 16 or 17, is characterized in that among the respective distances from the heat collecting section to the solar light collecting mirrors, the shortest distance is 10 m or more. That is, by using the solar light collecting mirrors of the present invention, solar light can be efficiently collected for the heat collecting section specifically located far away.

The solar light collecting mirror includes at least a reflective section and a frame. More preferably, the solar light collecting mirror further includes a base board and a supporting structural member. The central portion of the reflective section is positionally fixed in the X direction and the Y direction of the reflective section. At this time, it is preferable that the central portion of the reflective section is positionally fixed in the X direction and the Y direction by being fixed to the base board by being fixed to the base board via the frame. Here, it is preferable that the central portion of the frame on which the reflective section is formed is positionally fixed in the X direction and the Y direction. Further, the solar light collecting mirror is preferably a mirror for solar thermal power generation.

In the case where the central portion of each of the reflective section and the frame is fixed positionally in the X direction and the Y direction by being fixed to the base board, it is preferable that the central portion of each of the reflective section and the frame is fixed to the base board with a fixing member. Examples of the fixing member include a screw, a spacer, a magnet, and an adhesive. Here, although the fixing member may fix the frame to the base board by passing through the frame, it is preferable that the fixing member fixes the frame to the base board without passing through the reflective section. More preferably, the fixing member is not at all exposed on the surface of the reflective section. More specifically, in the case where the fixing member is a screw or a spacer and the solar light collecting mirror includes the frame on which the reflective section is formed, it is preferable that the fixing member fixes the frame to the base board by passing through the frame, the reflective section is disposed on the fixing member, the fixing member does not penetrate through the reflective section, and the fixing member (a screw head of a screw, or a part of a spacer) is not exposed on the reflective section. With the structure that the fixing member does not penetrate through the reflective section, it becomes possible to prevent the possibility that the end face of the penetrating portion of the reflective section deteriorates by coming in contact with outside air, and also it becomes possible to prevent the distortion of a portion of the reflective section near the penetrating portion. Further, with the structure that the fixing member is not at all exposed on the surface of the reflective section, since the whole surface of the reflective section can be used for reflecting solar light, the light collecting efficiency can be improved.

Furthermore, the fixing member may include a moving portion. For example, the fixing member includes a moving portion between a portion coming in contact with the base board and a portion coming in contact with the reflective section or the frame so as to provide flexibility to a positional relationship between the base board and the reflective section and the frame. With the extreme logic, although the central portion of the reflective section and the frame is basically fixed in the X direction and the Y direction, the central portion may be made move slightly in the X direction and the Y direction. With such a structure, it may possible to increase a possibility to obtain a more smoothly-curved concave surface.

Here, as shown in FIG. 5, the terms "X direction" and "Y direction" represent directions parallel to the flat surface of the reflective section, and the X direction and the Y direction are made orthogonal to each other. Further, the term "central portion" mentioned herein means a portion in the vicinity of a center when the reflective section is viewed in the direction perpendicular to the surface of the reflective section. Preferably, the central portion is a portion in the vicinity of the center of gravity. It is preferable that the area of the central portion is 10% or less of the whole area of the surface of the frame.

The relative position in the Z direction between the central portion and peripheral portion of the reflective section is changeable. Here, as shown in FIG. 5, the term "Z direction" represents the direction vertical to the flat surface of the reflective section. As one example, a relative position in the Z direction between the central portion of the frame on which the reflective section is formed and the peripheral portion of the frame on which the reflective section is formed is changeable.

At this time, the central portion may be positionally fixed in the Z direction and the peripheral portion may be positionally changeable in the Z direction; the peripheral portion may be positionally regulated in the Z direction and the central portion may be positionally changeable in the Z direction; or both the peripheral portion and the central portion may be positionally changeable in the Z direction. Preferably, the peripheral portion may be positionally regulated in the Z direction and the central portion may be positionally changeable in the Z direction.

Examples of the term "regulation in the Z direction" include the following configuration. For example, the supporting structural member with a prescribed height in the Z direction is disposed on the base board which supports the reflective section and the frame, and the peripheral portion of the reflective section and the frame is arranged so as to come in contact with the upper portion of the supporting structural member, whereby the peripheral portion can be made to always have a height in the Z direction which never becomes lower than the height of the supporting structural member. However, in this case, when looking one point of the peripheral portion of the reflective section and the frame, there is possibility that the one point positionally changes in the Z direction while moving in the X and Y directions. Therefore, the term "regulation in the Z direction" does not exclude the above situation. That is, the term "regulation in the Z direction" does not mean "fixing in the Z direction".

Considerable examples of a means for changing a position in the Z direction include mechanisms in which a screw, a space, and a magnet disposed on the central portion of the reflective section and the frame is moved manually or via an actuator in the Z direction. For example, a screw is disposed so as to penetrate through the central portion of the base board and the central portion of the reflective section and the frame. In response to the tightened amount of the screw, the central portion of the reflective section and the frame can be positionally changed in the Z direction. Further, in response to it, the curvature of the concave mirror can also be changed. The above-mentioned fixing member may also serve as the means for changing a position in the Z direction. Further, the below-mentioned supporting structural member may also serve as the means for changing a position in the Z direction.

The peripheral portion of each of the reflective section and the frame is not positionally fixed in the X direction and the Y direction. For example, in the case where the supporting structural member is disposed on the base board and the reflective section and the frame are arranged so as to come in contact with the upper portion of the supporting structural member, when the relative position in the Z direction between the central portion and the peripheral portion is changed, the reflective section and the frame can slide and move on the supporting structural member while coming in contact with the supporting structural member.

By making the reflective section and the frame elastically deform so as to change the relative position in the Z direction between the central portion and the peripheral portion, a concave mirror structure can be attained. Further, the concave mirror structure can be shaped in a good-looking curved surface. That is, it becomes possible to obtain a configuration with high light collecting efficiency, such as a paraboloidal surface or approximately paraboloidal surface configuration. Moreover, since the peripheral portion is not fixed, when the relative position in the Z direction between the central portion and the peripheral portion is changed so as to shape a reflective member into a concave mirror, it is also possible to prevent distortion from taking place on the peripheral portion.

Here, the term "reflective section" means a member which can reflect solar light and can elastically deform. Examples of the reflective section include a thick glass mirror, a thin glass plate mirror, and a film mirror. In the case where the reflective section is a thick glass mirror, it is desirable that the glass is made elastically deformable. In the case where the reflective section is a film mirror or a thin glass plate mirror, it is desirable to fix them onto an elastically deformable frame. In the case where the reflective section is made elastically deformable, the reflective section has preferably a Young's modulus of 90 GPa or more. The reflective section may be a single sheet, or may be divided into multiple sheets. Further, the reflective section may be shaped preferably in a circle, ellipse, tetragon such as square and rectangle, and right hexagon. The central portion of the reflective section is preferably positioned in the vicinity of the center in the case of a circle, in the vicinity of an intersection point of diagonal lines in the case of a tetragon, and in the vicinity of an intersection point of diagonal lines in the case of a right hexagon.

The term "film mirror" means a film-shaped mirror in which a reflective layer is disposed on a film-shaped resin substrate. The film has a thickness of 50 to 400 µm, preferably 70 to 250 µm, and particularly preferably 100 to 220 µm. With a thickness of 50 µm or more, in the case where the film mirror is pasted on the frame, since it becomes easy to acquire a good regular reflectance without deflection of the mirror, it is desirable. Further, with a thickness of 400 µm or less, it is desirable, because the handling property is easy.

As the reflective section of a solar light collecting mirror for use in a tower type solar thermal power generation system, it is desirable that a thickness from the surface of a film mirror to a reflective layer is 0.2 mm or less. The reasons for it are described in detail below.

In a system in which a distance from a reflective section to a heat collecting section is long as with a tower type solar power generation system, an entering angle of solar light which enters a film mirror may become large in the morning or the evening. (For example, 45 degrees or more) In such a case, as shown in FIG. 10(b), if a surface layer (a layer which exists between the surface of a film mirror and a reflective layer and may be composed of a single layer or multiple layers collectively called a surface layer) is thick, the following problems may occur. In the case where dust 100 adheres on the surface of a film mirror, a light flux B entering a portion where the dust 100 exists does not naturally enter a reflective layer 102 and may not be reflected or may be scattered. Accordingly, the light flux B does not contribute to the light collecting efficiency. In addition to that, a light flux A entering a portion where the dust 100 does not exist passes through the film mirror 101, and is reflected on the reflective layer 102. However, since the entering angle is large, a problem arises such that the reflected light flux A is blocked by the dust 100, and does not contribute to the light collecting efficiency. In contrast, as shown in FIG. 10(a), if a surface layer is made as thin as 0.2 mm or less, only a light flux B' entering a portion where the dust 100 exists contributes to the lowering of the light collecting efficiency, and it becomes possible to prevent a light flux reflected on the reflective layer as with the light flux A in FIG. 10(b) from contributing to the lowering of the light collecting efficiency. Accordingly, when dust adhere, since it becomes possible to prevent the lowering of light collecting efficiency, it is desirable. That is, by thinning the surface layer of a film mirror as thin as 0.2 mm or less, when dust adheres to the surface, even if an entering angle of light is large, the problem of the reflected light like the light flux A does not occur, and the lowering of the light collecting efficiency can be prevented. Accordingly, it is desirable. The preferable matter that the thickness of the surface layer is made 0.2 mm or less should not be limited to the film mirror. For example, in the other reflective sections such as a thin glass plate mirror, if the thickness of the surface layer is made 0.2 mm or less, it is desirable with the same reasons as the above. Hereafter, description will be given concretely with regard to the film mirror.

An example of the film mirror is shown in FIG. 1. In the example shown in FIG. 1, in a film mirror E, a polymer film layer 1, a gas barrier layer 2 composed of metal oxides, a reflective layer (Ag layer) 3 composed of metal, and a sticking layer 4 are laminated in the order from the solar light side. On the bottom surface of the sticking layer 4, a peelable film 5 is attached. When the film mirror E is pasted, the peelable film 5 is peeled off, and the film mirror E can be pasted and fixed to a frame.

The film mirror of the present invention should not be limited to the structure shown in FIG. 1, and it is desirable that various functional layers may be added to the film mirror. In contrast, the film mirror may be constituted to omit the gas barrier layer and the like. Further, even with above constitution, each of the layers may be provided with additional functions. Hereafter, description will be given to another embodiment of the film mirror in which various functional layers are added. However, the film mirrors usable in the present invention should not be limited to these embodiments. Here, in the following description, the term "upper" means the solar light entering side, and the term "lower" means the opposite side to the solar light entering side.

For example, in FIG. 1, the film mirror is configured such that the polymer layer 1 is made to contain an ultraviolet absorber, the gas barrier layer 2 disposed beneath the polymer layer 1 is made to function as a water steam barrier layer, further, the reflective layer 3 disposed beneath the gas barrier layer 2 is composed of a silver vapor-deposited layer, and beneath the silver vapor-deposited layer, the sticking layer 4 and the peelable layer 5 are laminated. By adding the ultraviolet absorber in the polymer layer 1, the durability can be increased.

Further, the above-mentioned film mirror may be made into a film mirror in which a corrosion inhibitor layer (polymer layer containing a corrosion inhibitor) is disposed between the reflective layer 3 and the sticking layer 4. By providing the corrosion inhibitor layer, the film mirror can be prevented from deteriorating against oxygen, hydrogen sulfide gas, and salt, and the film mirror can be provided with a smooth optical surface for a long period of time.

Furthermore, the above-mentioned film mirror may be made into a film mirror in which an adhesive layer and a corrosion inhibitor layer are laminated in this order from the solar light entering side between the gas barrier layer 2 and the reflective layer 3, and further, a polymer layer is provided between the reflective layer 3 and the sticking layer 4.

The above-mentioned film mirror may be made into a film mirror in which in place of the polymer layer 1 containing the ultraviolet absorber, a hard coat layer and a polymer film layer are laminated in this order from the solar light entering side. The hard coat layer preferably contains an ultraviolet absorber.

The above-mentioned film mirror may be made into a film mirror in which in place of the hard coat layer, an ultraviolet reflective layer is disposed on the polymer film layer.

The above-mentioned film mirror may be made into a film mirror in which in place of the corrosion inhibitor layer, a sacrificial corrosion prevention layer is disposed.

As another example, a film mirror preferably includes, sequentially from the light entering side, a hard coat layer; an acrylic resin layer which has a thickness of 50 μm or more and 300 μm or less and contains an ultraviolet absorber; an adhesive layer; a corrosion inhibitor layer; a silver reflective layer; an anchor layer for forming the silver reflective layer onto a substrate, the substrate made from polyethylene terephthalate, and a sticking layer. Further, as still another example, a film mirror preferably includes, sequentially from the light entering side, a hard coat layer; an acrylic resin layer which has a thickness of 50 μm or more and 300 μm or less and contains an ultraviolet absorber; a corrosion inhibitor layer; a silver reflective layer; n anchor layer for forming silver reflective layer onto a substrate, the substrate made from polyethylene terephthalate, and a sticking layer.

Subsequently, description will be given to each layer of the film mirror and raw materials used for the respective layers.

(Polymer Film Layer)

Preferable examples of film materials of the polymer film layer include polyesters, polyethylene terephthalate, polyethylene naphthalate, acrylic resins, polycarbonates, polyolefins, cellulose, and polyamides from the viewpoint of flexibility and weight reduction. In particular, acrylic copolymers prepared through copolymerization of two or more acrylic monomers are preferable in the point of excellent weather resistance.

Examples of the preferable acrylic copolymers include acrylic copolymers having a weight average molecular weight of 40,000 to 1,000,000, preferably 100,000 to 400,000 and prepared through copolymerization such as solution, suspension, emulsion or bulk polymerization, of one or more main monomer components selected from monomers having no functional group (hereafter referred to as non-functional monomers) in side chains, such as alkyl (meth)acrylates (e.g., methyl acrylate, ethyl acrylate, propyl acrylate, butyl acrylate, 2-ethylhexyl acrylate, 2-hydroxyethyl acrylate, methyl methacrylate, ethyl methacrylate, propyl methacrylate, butyl methacrylate, cyclohexyl methacrylate and 2-ethylhexyl methacrylate) in combination with one or more monomers having functional groups such as OH and COOH (hereafter referred to as functional monomers) in side chains, which are selected from 2-hydroxyethyl methacrylate, glycidyl methacrylate, acrylic acid, methacrylic acid, and itaconic acid. Among them, the most preferable acrylic polymer includes 50 to 90 mass % of non-functional monomers which give polymers having relatively low Tg, such as ethyl acrylate, methyl acrylate, and 2-ethylhexyl methacrylate; 10 to 50 mass % of non-functional monomers which give polymers having relatively high Tg, such as methyl methacrylate, isobutyl methacrylate, and cyclohexyl methacrylate; and 0 to 10 mass % of functional monomers such as 2-hydroxyethyl methacrylate, acrylic acid, and itaconic acid.

The configuration of the film may be a configuration requested as a surface covering material of various kinds of film mirrors, such as a flat surface, diffusing surface, concave surface, convex surface, and trapezoid.

The thickness of the polymer film layer is preferably 10 to 125 μm. If the thickness is thinner than 10 μm, tensile strength and tearing strength tend to become weak, and if the thickness is thicker than 125 μm, the average reflectance in a range of 1600 nm to 2500 nm becomes less than 80%.

In order to enhance adhesiveness with a metal oxide layer, hard coat layer, dielectric coating layer, and the like, the surface of the polymer film layer may be subjected to corona discharge treatment, plasma treatment, and the like.

Further, the polymer film layer preferably contains at least one of a benzotriazol type, benzophenone type, triazine type, cyanoacrylate type, and polymer type ultraviolet ray absorber.

(Ultraviolet Ray Absorber)

Preferably, the ultraviolet ray absorber (UV absorber) used in the polymer film layer is excellent in absorbing ability for ultraviolet rays with a wavelength of 370 nm or less and absorbs little visible light rays with a wavelength of 400 nm or more in view of the utilization of solar light.

Examples of the UV absorbers include oxybenxophenone compounds, benzotriazole compounds, salicylic ester compounds, benzophenone compounds, cyanoacrylate compounds, nickel-complex salt compounds, and triazine compounds. Among them, benzophenone compounds, and benzotriazole compounds and triazine compounds which cause little coloring, are preferable. Furthermore, UV absorbers disclosed in Japanese Unexamined Patent Application Publication Nos. Hei-10-182621 and Hei-8-337574, and polymer-type UV absorbers described in Japanese Unexamined Patent Application Publication Nos. Hei-6-148430 and 2003-113317 may also be used.

Specific examples of benzotriazole UV absorbers include, without being limited thereto, 2-(2'-hydroxy-5'-methylphenyl)benzotriazole, 2-(2'-hydroxy-3',5'-di-tert-butylphenyl) benzotriazole, 2-(2'-hydroxy-3'-tert-butyl-5'-methylphenyl) benzotriazole, 2-(2'-hydroxy-3',5'-di-tert-butylphenyl)-5- chlorobenzotriazole, 2-(2'-hydroxy-3'-(3',4",5",6"-tetrahydrophthal imidomethyl)-5'-methylphenyl)benzotriazole, 2,2-methylenebis(4-(1,1,3,3-tetramethylbutyl)-6-(2H-benzotriazole-2-yl) phenol), 2-(2'-hydroxy-3'-tert-butyl-5'-methylphenyl)-5-chlorobenzotriazole, 2-(2'-hydroxy-3'-tert-butyl-5'-(2-octyloxycarbonyl ethyl)-phenyl)-5-chlorobenzotriazole, 2-2'-hydroxy-3'-(1-methyl-phenylethyl)-5'-(1,1,3,3-tetra methylbutyl)-phenyl)benzotriazole, 2-(2H-benzotriazole-2-yl)-6-(straight chain and branched chain dodecyl)-4-methylphenols, and a mixture of octyl-3-[3-tert-butyl-4-hydroxy-5-(chloro-2H-benzotriazole-2-yl)phenyl]propionate and 2-ethylhexyl-3-[3-tert-butyl-4-hydroxy-5-(5-chloro-2H-benzotriazole-2-yl)-phenyl]propionate.

Examples of commercially available UV absorbers include TINUVIN 171, TINUVIN 900, TINUVIN 928, and TINUVIN 360 (all produced by Ciba Japan Co., Ltd.); LA 31 (produced by ADEKA Corporation); and RUVA-100 (produced by Otsuka Chemical Co., Ltd.).

Specific examples of benzophenone compounds include, without being limited thereto, 2,4'-dihydroxy benzophenone, 2,2'-dihydroxy-4-methoxy benzophenone, 2-hydroxy-4-methoxy-5-sulfo benzophenone, and bis(2-methoxy-4-hydroxy-5-benzoyl phenylmethane).

(Gas Barrier Layer Composed of Metal Oxides)

Examples of the metal oxide used for a gas barrier layer include silicon oxide, aluminum oxide, composite oxide including silicon oxide and aluminum oxide as starting materials, zinc oxide, tin oxide, indium oxide, niobium oxide, and chromium oxide. In particular, silicon oxide, aluminum oxide, and composite oxide including silicon oxide and aluminum oxide as starting materials are preferable from the viewpoint of water vapor barrier properties. Furthermore, the gas barrier layer may be a multilayer film in which low refractive index layers with a refractive index of 1.35 to 1.8 at a wavelength of 550 nm and high refractive index layers with a refractive index of 1.85 to 2.8 at a wavelength of 550 nm are laminated alternately. Examples of the low refractive index layer material include silicon oxide, aluminum oxide, silicon nitride, and aluminum nitride. Examples of the high refractive index layer material include niobium oxide, titanium oxide, zinc oxide, tin oxide, indium oxide, tantalum oxide, and zirconium oxide. These layers are formed by a PVD (physical vapor deposition) process such as a vacuum deposition method, sputtering method or ion plating; or a vacuum process such as a CVD (chemical vapor deposition) process. The gas barrier layer composed of the metal oxides preferably has a thickness of 5 to 800 nm, more preferably 10 to 300 nm.

As the gas barrier layer produced on the polymer film, a silicon oxide layer, aluminum oxide layer, and composite oxide layer including silicon oxide and aluminum oxide as starting materials which are prepared in the above ways, are excellent in high barrier action against gas such as oxygen, carbon dioxide, and air, and water vapor.

Further, a laminated member of the polymer film and one of the silicon oxide layer, the aluminum oxide layer, and the composite oxide layer including silicon oxide and aluminum oxide as starting materials has preferably a water vapor permeation rate of $1 \times 10^{-2}$ g/m²·24 h or less at 40° C. and 90% RH. The water vapor permeation rate can be measured with the water vapor permeation rate measuring device PERMATRAN-w3-33 manufactured by MOCON Corporation.

Furthermore, each of the silicon oxide layer, the aluminum oxide layer, and the composite oxide layer including silicon oxide and aluminum oxide as starting materials has preferably a thickness of 1 µm or less and an average light ray transmittance of 90% or more. With this, light is substantially not lost and solar light can be reflected efficiently.

(Thickness Ratio of the Gas Barrier Layer Composed of the Metal Oxides to the Polymer Film Layer)

The thickness ratio of the gas barrier layer composed of the metal oxides to the polymer film layer is preferably in a range of 0.1% to 5%. When the ratio is larger than 0.1%, that is, when the thickness of the gas barrier layer becomes thicker against the polymer film layer, the gas barrier property becomes sufficient so that a function to suppress the advancing of deterioration can be exhibited, which is preferable. When the ratio is smaller than 5%, that is, when the thickness of the gas barrier layer becomes thinner against the polymer film layer, when a bending force is applied from the outside, the metal oxide is not likely to cause cracks. As a result, the gas barrier property can be maintained so that a function to suppress the advancing of deterioration can be exhibited, which is preferable.

(Reflective Layer Composed of Metals)

Examples of metals used for a reflective layer include silver and a silver alloy, in addition, gold, copper, aluminum, and an alloy of these metals. In particular, silver is preferably used. Such a reflective layer acts as a role of a reflective film to reflect light. By forming the refracting layer with a film composed of silver or a silver alloy, it becomes possible to enhance the reflectance of a film mirror in a range from an infrared region to a visible light region and to reduce the dependency of the reflectance on an entering angle. The range from an infrared region to a visible light region means a wavelength region from 400 to 2500. The entering angle means an angle against a line (normal line) vertical to the film surface.

As the silver alloy, from the viewpoint that the durability of the reflective layer can be improved, the alloy is preferably composed of silver and at least one of other metals selected from a group consisting of gold, palladium, tin, gallium, indium, copper, titanium, and bismuth. As the other metals, from the viewpoints of resistance to high temperature and high humidity and reflectance, gold is particularly preferable.

In the case where the reflective layer is a film composed of a silver alloy, the content of silver is 90 to 99.8 atom % to the total amount (100 atom %) of the silver and other metals in the reflective layer. Further, from the viewpoint of durability, the content of other metals is preferably 0.2 to 10 atom %.

Further, the thickness of a reflective layer is preferably 60 to 300 nm, and particularly preferably 80 to 200 nm. When the thickness of the reflective layer is larger than 60 nm, the thickness is enough not to allow light to penetrate. Accordingly, since the sufficient reflectance of the film mirror in the visible light region can be ensured, it is desirable. The reflectance also becomes larger in proportion to the thickness. However, if the thickness is not less than 200 nm, the reflectance does not depend on the thickness. When the thickness of the reflective layer is less than 300 nm, convexoconcave is not likely to take place on the surface of the reflective layer. With this, since the scattering of light is not likely to occur, the reflectance does not lower in the visible light region, which is desirable.

The film mirror is required to have gloss. However, according to a method of pasting metallic foils, since the surface includes convexoconcave, gloss may be lost. That is, in the film mirror which is required to have uniform surface roughness over the wide area, it is not preferable to adopt metal foil laminate as a production method. It is preferable to form a reflective layer composed of metals by wet type plating or dry type plating such as vacuum vapor deposition. Alternatively, it may be also preferable that a coating solution containing a silver complex compound is coated, and the coated silver complex compound is reduced by firing or a reducing agent so as to generate silver and to form a reflective layer.

(Sticking Layer)

As the sticking layer, any one of dry lamination agents, wet lamination agents, adhesive agents, heat sealing agents, and hot melt agents may be employed without being limited thereto. For examples, polyester resins, urethane resins, polyvinyl acetate resins, acrylic resins, and nitrile rubbers may be used. As a lamination method, without being limited thereto, lamination may be preferably performed continuously with a roll laminator from the viewpoint of economic efficiency and productivity. The thickness of the sticking layer may be usually selected from a range of 1 to 50 µm. When the thickness is larger than 1 µm, since the sufficient sticking effect can be obtained, it is desirable. On the other hand, when the thickness is less than 50 µm, the drying speed is not likely to become slow, because the sticking layer is not too thick, which is efficient. Further, the original sticking force can be obtained, and a problem that some solvents remain may not occur.

(Peelable Film)

The peelable film preferably includes a substrate and a separating agent provided on the substrate.

In the peelable film, its outer surface has a high smoothness. Examples of the separating agent constituting the peelable film include alkyd resins, such as silicone resin, long chain alkyl resin, fluorine resin, fluoro silicone resin, long chain alkyl modified alkyd resin, and silicone modified alkyd resin.

Among the above-mentioned resins, in the case where silicone resin is used as a material of the separating agent, more excellent peeling property is exhibited.

As the silicone resin, any one of an addition type, condensation type, and solventless type may be used.

Although the average thickness of the separating agent constituting the peelable film is not specifically limited, it is preferably 0.01 to 0.3 µm, and more preferably 0.05 to 0.2 µm. If the average thickness of the separating agent is larger than the above lower limit, the function as the separating agent is sufficiently exhibited. On the other hand, if the average thickness of the separating agent is smaller than the above upper limit, when the peelable film is wound up in the form of a roll, blocking is not likely to take place and trouble does not occur at the time of feeding, which is preferable.

(Corrosion Inhibitor Layer)

The corrosion inhibitor layer functions to prevent discoloration of the reflective layer (specifically, an Ag layer) composed of metals, and examples of the corrosion inhibitor include a thioether type, thiol type, nickel based organic compound type, benzotriazol type, imidazole type, oxazol type, tetrazaindene type, pyrimidine type, and thia diazole type.

The preferably-used corrosion inhibitor is divided roughly into a corrosion inhibitor having an adsorption group with silver and an antioxidant. Hereafter, specific examples of these corrosion inhibitor and antioxidants will be described.

(Corrosion Inhibitor Having an Absorptive Group with Silver)

The corrosion inhibitor having an absorptive group with silver is preferably selected from at least one compound of amines and derivatives thereof, compounds having pyrrole rings, compounds having triazole rings, compounds having pyrazole rings, compounds having thiazole rings, compounds having imidazole rings, compounds having indazole rings, copper chelate compounds, thioureas, compounds having mercapto groups, and naphthalene compounds, and mixtures thereof.

Examples of the amines and derivatives thereof include ethylamine, laurylamine, tri-n-butylamine, o-toluidine, diphenylamine, ethylenediamine, diethylenetriamine, triethylenetetramine, tetraethylenepentamine, monoethanolamine, diethanolamine, triethanolamine, 2N-dimethylethanolamine, 2-amino-2-methyl-1,3-propanediol, acetamide, acrylamide, benzamide, p-ethoxychrysoidine, dicyclohexylammonium nitrite, dicyclohexylammonium salicylate, monoethanolamine benzoate, dicyclohexylammonium benzoate, diisopropylammonium benzoate, diisopropylammonium nitrite, cyclohexylamine carbamate, nitronaphyhaleneammonium nitrite, cyclohexylamine benzoate, dicyclohexylammonium cyclohexanecarboxylate, cyclohexylamine cyclohexanecarboxylate, dicyclohexylammonium acrylate, cyclohexylamine acrylate, and mixtures thereof.

Examples of the compound having a pyrrole ring include N-butyl-2,5-dimethylpyrrole, N-phenyl-2,5-dimethylpyrrole, N-phenyl-3-formyl-2,5-dimethylpyrrole, N-phenyl-3,4-diformyl-2,5-dimethylpyrrole, and mixtures thereof.

Examples of the compound having a triazole ring include 1,2,3-triazole, 1,2,4-triazole, 3-mercapto-1,2,4-triazole, 3-hydroxy-1,2,4-triazole, 3-methyl-1,2,4-triazole, 1-methyl-1,2,4-triazole, 1-methyl-3-mercapto-1,2,4-triazole, 4-methyl-1,2,3-triazole, benzotriazole, tolyltriazole, 1-hydroxybenzotriazole, 4,5,6,7-tetrahydrotriazole, 3-amino-1,2,4-triazole, 3-amino-5-methyl-1,2,4-triazole, carboxybenzotariazole, 2-(2'-hydroxy-5'-methylphenyl)benzotriazole, 2-(2'-hydroxy-5'-tert-butylphenyl)benzotriazole, 2-(2'-hydroxy-3',5'-di-tert-butylphenyl)benzotriazole, 2-(2'-hydroxy-4-octozyphenyl)benzotriazole, and mixtures thereof.

Examples of the compounds having a pyrazole ring include pyrazole, pyrazoline, pyrazolone, pyrazolidine, pyrazolidone, 3,5-dimethylpyrazole, 3-methyl-5-hydroxypyrazole, 4-aminopyrazole, and mixtures thereof.

Examples of the compounds having a thiazole ring include thiazole, thiazoline, thiazolone, thiazolidine, thiazolidone, isothiazole, benzothiazole, 2-N,N-diethylthiobenzothiazole, p-dimethylaminobenzalrhodanine, 2-mercaptobenzothiazole, and mixtures thereof.

Examples of the compounds having an imidazole ring include imidazole, histidine, 2-heptadecylimidazole, 2-methylimidazole, 2-ethyl-4-methylimidazole, 2-phenylimidazole, 2-undecylimidazole, 1-benzyl-2-methylimidazole, 2-phenyl-4-methylimidazole, 1-cyanoethyl-2-methylimidazole, 1-cyanoethyl-2-phenylimidazole, 1-cyanoethyl-2-ethyl-4-methylimidazole, 1-cyanoethyl-2-undecylimidazole, 2-phenyl-4-methyl-5-hydroxymethylimidazole, 2-phenyl-4,5-dihydroxymethylimidazole, 4-formylimidazole, 2-methyl-4-formylimidazole, 2-phenyl-4-formylimidazole, 4-methyl-5-formylimidazole, 2-ethyl-4-methyl-5-formylimidazole, 2-phenyl-4-methyl-4-formylimidazole, 2-mercaptobenzimidazole, and mixtures thereof.

Examples of the compound having an indazole ring include 4-cloroindazole, 4-nitroindazole, 5-nitroindazole, 4-cholo-5-nitroindazole, and mixtures thereof.

Examples of the copper chelate compounds include copper acetylacetone, copper ethylenediamine, cooper phthalocyanine, copper ethylenediaminetetraacetate, copper hydroxyquinoline, and mixtures thereof.

Examples of the thioureas include thiourea, guanylthiourea, and mixtures thereof.

Examples of the compound having a mercapto group, in addition to the materials described above, include mercaptoacetic acid, thiophenol, 1,2-ethanedithiol, 3-mercapto-1,2, 4-triazole, 1-methyl-3-mercapto-1,2,4-triazole, 2-mercaptobenzothiazole, 2-mercaptobenzimidazole, glycol dimercaptoacetate, 3-mercaptobenzimidazole, and mixtures thereof.

The naphthalene compounds include, thionalide and the like.

(Antioxidant)

As the antioxidants pertaining to the present invention, it is preferable to use a phenol type antioxidant, thiol type antioxidant and phosphite type antioxidant. Examples of the phenol type antioxidant include 1,1,3-tris(2-methyl-4-hydroxy-5-t-butylphenyl) butane, 2,2'-methylenebis(4-ethyl-6-t-butylphenol), tetrakis-[methylene-3-(3',5'-di-t-butyl-4'-hydroxyphenyl) propionate]methane, 2,6-di-t-butyl-p-cresol, 4,4'-thiobis(3-methyl-6-t-butylphenol), 4,4'-butylidenebis (3-methyl-6-t-butylphenol), 1,3,5-tris(3',5'-di-t-butyl-4'-hydroxybenzyl)-S-triazine-2,4,6-(1H, 3H, 5H)trione, stearyl-β-(3,5-di-t-butyl-4-hydroxyphenyl) propionate, triethylene glycol bis[3-(3-t-butyl-5-methyl-4-hydroxyphenyl) propionate], 3,9-bis{1,1-di-methyl-2-[β-(3-t-butyl-4-hydroxy-5-methylphenyl) propionyloxy]ethyl}-2,4,8,10-tetraoxioxaspiro[5,5]undecane, and 1,3,5-trimethyl-2,4,6-tris(3,5-di-t-butyl-4-hydroxybenzyl)benzene.

As the phenol type antioxidant, a phenol type antioxidant having a molecular weight of 550 or more is specifically preferable. Examples of the thiol type antioxidant include distearyl-3,3'-thiodipropionate, pentaerythritol-tetrakis-(β-lauryl-thiopropionate), and the like. Examples of the phosphite type antioxidant include tris(2,4-di-t-butylphenyl) phosphate, distearylpentaerythritol diphosphite, di(2,6-di-t-butylphenyl)pentaerythritol diphosphite, bis-(2,6-di-t-butyl-4-methylphenyl)-pentaerythritol diphosphite, tetrakis(2,4-di-t-butylphenyl)-4,4-biphenylene-diphosphonite, 2,2'-methylenebis(4,6-di-t-butylphenyl) octylphosphate, and the like As a method of producing a film mirror, the following methods may be employed. On the top surface of a polymer film layer, a reflective layer composed of metals is formed, and further, on the above reflective layer, a corrosion inhibitor layer is laminated. Beneath the bottom surface of the polymer film layer, a sticking layer and a peelable layer are laminated, thereafter, on the uppermost surface of the polymer film layer, that is, on the corrosion inhibitor layer, an adhesive layer may be formed. On the bottom surface of another polymer film layer, a gas barrier layer is formed, and then, the gas barrier layer of the another polymer film layer and the adhesive layer of the above polymer film layer may be made to face each other and pasted to each other.

(Adhesive Layer)

The adhesive layer is composed of resin and used to make a film adhere to (being in close contact with) the above-mentioned polymer film layer containing the UV absorber. Therefore, the adhesive layer is required to have an adhesive property to make the film adhere to the polymer film layer containing the UV absorber, smoothness for deriving high reflection performance which a reflective layer composed of metals originally has, and transparency.

Resins used for the adhesive layer are not specifically limited, as long as they satisfy the above conditions of the adhesive property, smoothness and transparency. The resins such as polyester based resin, acryl based resin, melamine based resin, epoxy based resin, polyamide based resin, vinyl chloride based resin, and vinyl chloride vinyl acetate copolymer based resin may be used singly or as a mixture of these resins. From the viewpoint of weather resistance, a mixed resin of polyester based resin and melamine based resin is preferable. It is more preferable to use them as a heat-curing type resin by mixing them with a curing agent such as isocyanate.

The thickness of the adhesive layer is preferably 0.01 to 3 μm, and more preferably 0.1 to 1 μm. If the thickness is thinner than 0.01 μm, the adhesive property becomes worse, and the effect obtained by the formation of the adhesive layer may be lost. Further, it becomes difficult to cover convex and concave on the surface of the film base material, which results in that the flatness becomes worse. Accordingly, the thinner thickness is not preferable. On the other hand, if the thickness is thicker than 3 μm, it is not expected to improve the adhesive property. Further, the thicker adhesive layer may cause coating irregularities, which leads to that the flatness becomes worse. Furthermore, the thicker adhesive layer may cause the case where the hardening of the adhesive layer becomes insufficient. Accordingly, the thicker thickness is not preferable.

As a method for forming the adhesive layer, the conventionally well-known coating methods such as a photogravure coating method, a reverse coating method, and a die coating method may be utilized.

(Hard Coat Layer)

As the outermost layer of the film mirror, a hard coat layer may be disposed. The hard coat layer is provided for preventing scratching.

The hard coat layer may be composed of, for example, acrylic resins, urethane resins, melamine resins, epoxy resins, organic silicate compounds, and silicone resins. In particular, from the viewpoints of hardness and durability, silicone resins and acrylic resins are preferable. Furthermore, from the viewpoints of curability, flexibility, and productivity, the hard coat layer may be preferably composed of active energy ray curable acrylic resins or heat curable acrylic resins.

The active energy ray curable acrylic resins or heat curable acrylic resins are a composition including a polyfunctional acrylate, acrylic oligomer, or reactive diluent as a polymerizable curing component. Further, the composition containing photoinitiators, photosensitizers, heat polymerization initiators, and modifiers in addition to the above as necessary may be used.

Examples of the acrylic oligomer include oligomers having acrylic resin skeletons bonded with reactive acrylic groups, and other oligomers such as polyester acrylates, urethane acrylates, epoxy acrylates, and polyether acrylates. Further, acrylic oligomers having rigid skeletons, such as melamine and isocyanuric acid, bonded with acrylic groups may be used.

The reactive diluents have a function as a solvent in a coating process as a medium of a coating agent, and includes in itself a group capable of reacting with mono-functional or poly-functional acrylic oligomers so that the reactive diluents become a copolymerization component of a coating layer.

Examples of the commercially available polyfunctional acrylic curable coating materials include commercial products such as trade name "DIABEAM (registered trademark)" series produced by Mitsubishi Rayon Co., Ltd.; trade name "DENACOL (registered trademark)" series produced by Nagase & CO., Ltd.; tradename "NK ester" series produced by Shin-Nakamura Chemical Co., Ltd.; trade name "UNIDIC (registered trademark)" series produced by DIC Corporation), trade name "Aronix (registered trademark)" series produced by TOAGOSEI Co., Ltd.), trade name "BLEMMER (registered trademark)" produced by NOF Corporation; trade name "KAYARAD (registered trademark)" series produced by Nippon Kayako Co., Ltd.; and trade name "LIGHT ESTER" and "LIGHT ACRYLATE" series produced by Kyoeisha Chemical Co., Ltd.

Further, in the hard coat layer, various additives may be blended as necessary. For example, stabilizers, such as antioxidants, light stabilisers, and UV absorbers, surfactants, leveling agents, and antistatic agents may be used.

The leveling agents are particularly effective to reduce surface irregularities at the time of coating functional layers. Preferable examples of the leveling agents include silicone leveling agents such as dimethyl polysiloxane-polyoxy alkylene copolymers (e.g., SH190 manufactured by Dow Corning Toray Co., Ltd.).

(Ultraviolet Reflective Layer)

The ultraviolet reflective layer may be disposed on the film mirror. The ultraviolet reflective layer is a layer which reflects ultraviolet rays and allows visible light and infrared light to pass therethrough. The ultraviolet reflective layer preferably has an average reflectance of 75% or more for electromagnetic waves (ultraviolet rays) with a wavelength of 300 nm to 400 nm. Further, the ultraviolet reflective layer preferably has an average reflectance of 80% or more for electromagnetic waves (visible light and infrared light) with a wavelength of 400 nm-2500 nm.

In the film mirror, the polymer film layer is disposed at the solar light entering side of the metallic reflective layer such that solar light having passed through the polymer film layer is reflected on the metallic reflective layer. Accordingly, the polymer film layer is always exposed to solar light. Therefore, by disposing the ultraviolet reflective layer at the solar light entering side of the polymer film layer, it becomes possible to prevent deterioration and discoloration of the polymer film layer due to ultraviolet rays. Consequently, since it becomes possible to reduce the lowering of the light ray transmittance of the polymer film layer, it becomes possible to reduce the lowering of the reflectance of the film mirror. Further, by disposing the ultraviolet reflective layer at the solar light entering side of the polymer film layer, it becomes possible to reduce the lowering of the moisture proof property of the polymer film layer caused by the deterioration of the polymer film layer due to ultraviolet rays of solar light. Consequently, since it becomes possible to reduce the deterioration of the metallic reflective layer associated with the deterioration of the moisture proof property of the polymer film layer, it becomes also possible to reduce the lowering of the reflectance of the film mirror.

Usable examples of the ultraviolet reflective layer include, without being limited thereto, a dielectric multilayer composed of alternately-laminated layers of two or more kinds of dielectric materials different in refractive index. The dielectric multilayer pertaining to the present invention may be preferably constituted such that a dielectric layer with a high refractive index and a dielectric layer with a low refractive index are alternately laminated to form two to six laminated layers. In this way, by laminating dielectric layers to form a multi layer structure, it becomes possible to enhance the scratching resistance of the dielectric multi layer. The dielectric layer with a high refractive index preferably has a refractive index of 2.0 to 2.6. Further, the dielectric layer with a low refractive index preferably has a refractive index of 1.8 or less.

In the dielectric layer with a high refractive index, $ZrO_2$ and $TiO_2$ may be preferably used, and in the dielectric layer with a low refractive index, $SiO_2$ and $Al_2O_3$ may be preferably used. More preferably, TiO2 is used in the dielectric layer with a high refractive index, and $SiO_2$ is used in the dielectric layer with a low refractive index. In the case where $TiO_2$ is used in the dielectric layer with a high refractive index on the uppermost surface of the ultraviolet reflective layer, i.e., on the uppermost surface of the film mirror, antifouling effect for the mirror surface can be obtained owing to the photocatalytic effect of the $TiO_2$. Accordingly, it becomes possible to reduce the lowering of the reflectance of the film mirror due to the fouling of the mirror surface.

(Sacrificial Corrosion Prevention Layer)

The film mirror may include a sacrificial corrosion prevention layer. The sacrificial corrosion prevention layer is a layer used to prevent the corrosion of the metallic reflective layer by sacrificial corrosion. By disposing the sacrificial corrosion prevention layer between the metallic reflective layer and the protective layer, it becomes possible to improve the corrosion resistance of the metallic refractive layer. The sacrificial corrosion prevention layer may preferably contains copper with an ionization tendency higher than silver. By disposing the sacrificial corrosion prevention layer composed of copper beneath the refractive layer composed of silver, it becomes possible to suppress the deterioration of silver.

The film mirror can be produced, for example, by the following processes.

[Process 1]

As a polymer film layer (substrate), a biaxial stretched polyester film (a polyethylene terephthalate film with a thickness of 60 μm) is prepared. The polyester film is placed inside a vapor depositing device, and the inside of the vapor depositing device is made into a vacuum with a vacuum pump. In the inside of the vapor depositing device, a feeding device to feed a polymer film wound in the form of a roll and a rewinding device to rewind the polymer film on which metal vapor is deposited by vapor deposition processing are disposed. Between the feeding device and the rewinding device, a number of rollers are arranged so as to guide the polymer film, and the rollers are driven and rotated by a driving means in synchronization with the travelling of the polymer film.

[Process 2]

At a position to face the polymer film on the upstream side in terms of the travelling direction, a vapor deposition core evaporating source to evaporate metal oxides is arranged. The vapor deposition core evaporating source is configured to vapor-deposit metals, such as Si, Al, Ag, and Cu onto the polymer film. That is, the vapor deposition core evaporating source generates metal vapor by a vacuum deposition method and forms a metal oxide vapor deposition film and a metal vapor deposition film uniformly over the entire width of the polymer film.

[Process 3]

On the surface of the metal vapor deposition film produced at Process 2, a polyester-based adhesive is coated with a thickness of 5 μm. The producing order should not be limited to the above order, a corrosion inhibitor with an effect to prevent the deterioration of metals may be coated after Process 2, and similarly, in order to prevent the deterioration of metals, a sacrificial corrosion prevention layer, for example, Cu, may be vapor-deposited.

Further, in order to protect the polymer film from strong ultraviolet rays, an ultraviolet absorber may be added into the polymer film, and, other than it, a hard coat layer disposed at the solar light entering side, thereby preventing coloring and maintaining the reflecting efficiency.

The above description serves as description about the term "film mirror".

Next, the term "thin glass plate mirror" means a mirror in which a reflective layer is disposed on a thin glass base material. The thickness of the glass is preferably 25 to 1500 μm. The thin glass plate mirror can be attached directly to a base board without being disposed on a frame. However, the thin glass plate mirror may be fixed on the frame, and then attached to the base board.

The "frame" can elastically deform, and on its surface, a reflective section is formed. For example, the reflective section, such as a film mirror and a thin glass plate mirror, may be pasted and fixed onto the surface of the frame with an adhesive or an agglutinant (sticking agent). The reflective section may be directly disposed on the frame, or the reflective section may be disposed on the frame via another elastic deformable member. Examples of another elastic deformable member include a thin plate and a thin film which is configured to cover an entire surface or a part of the surface of the frame. At the time of enabling an elastic deformation, the frame has a Young's modulus of 10 GPa or more, and preferably has a Young's modulus higher than that of "the reflective section".

Preferable examples of the configuration of the frame viewed from the direction orthogonal to the surface of the frame include a circle, ellipse, tetragon such as square and rectangle, and right hexagon. The configuration and size of the frame viewed from the direction orthogonal to the surface of the frame are preferably the same as the configuration and size of the reflective section viewed from the direction orthogonal to the surface of the reflective section. The frame preferably includes an outer frame member which defines the outer profile configuration of the frame and keeps the strength. Examples of the outer frame member include a thin-thickness long plate member, a thicker bar-shaped member, and a bar-shaped member with a cross section in the form of a "▫" character, a "⊐" character, a "工" character, a "凸" character, and a "凹" character.

Further, the frame is formed from two or more beams, and includes at least warp members. The warp members means member which extend radially from a position (preferably, at the central portion of the frame) corresponding to the central portion of the reflective section. Examples of the configuration of the warp members include a thin-thickness long plate member, a thicker bar-shaped member, and a bar-shaped member with a cross section in the form of a "▫" character, a "⊐" character, a "工" character, a "凸" character, and a "凹" character. It is preferable that on the supposition that the number of warp members extending radially from a position corresponding to the central portion is n (pieces) and the radius of the frame is L (m), the following conditional expression is satisfied.

$$6 \cdot L \leq n \leq 10 \cdot L \quad (1)$$

For example, in the example of the frame shown in FIG. 6, the number of warp members extending radially from a position corresponding to the central portion is to be counted as sixteen. Further, it is preferable that the radius of the frame is the diameter of an inscribed circle in the configuration of the frame looked from the direction orthogonal to the surface of the frame. It is more preferable that n is a value of an integer obtained by rounding off the value of 8·L.

Further, it is preferable that the frame includes woof members. The woof members are members with which the warp members are connected to each other in the circumferential direction. In the case where the woof members are disposed, it is preferable to connect the woof members in the form of concentric circles or approximately concentric circles around the central portion of the frame. In the case where each of the woof members has a straight-lined structure, although the formed concentric circles do not become the perfect concentric circles, connecting the woof members in the form of a polygonal shape close to a circle as shown in FIG. 8 corresponds to connecting in the form of approximately concentric circles as mentioned herewith. Further, Examples of the configuration of the woof members include a thin-thickness long plate member, a thicker bar-shaped member, and a bar-shaped member with a cross section in the form of a "▫" character, a "⊐" character, a "工" character, a "凸" character, and a "凹" character.

Furthermore, the frame may be a single structure, or a single frame is constituted by a combination of multiple frame units. For example, as shown in FIG. 7, a large square-shaped frame may be constituted by a combination of four square-shaped frame units. In the case of multiple frame units, the multiple frame units are provided with respective reflective sections, and thereafter, the multiple frame units with the respective reflective sections are combined to form a single large frame and reflective section. Example of the material of the frame include aluminum, FRP, SUS, steel plate, resin, and wooden plates, such as plywood (preferably, having been subjected to water proof treatment). It is preferable that the central portion of the frame is in the vicinity of the center in the case of a disc, in the vicinity of the intersection point between diagonal lines in the case of a square shape, and also in the vicinity of the intersection point between diagonal lines in the case of a regular hexagon shape.

The "base board" is a component member configured to support the reflective section and the frame. More specifically, it is desirable that the central portion of the reflective section or the frame is fixed to the base board, and that the central portion is positionally fixed in the X and Y directions. The surface of the base board is preferably a smooth flat surface. However, if the base board has a structure that the frame and the reflective portion are fixed at the central portion and on which a later-mentioned supporting structure is fixed, the base board may not have a plate-shaped structure. Further, the base board preferably has a certain amount of rigidity, and for example, the base board has a Young's modulus being two times or more that of each of the reflective section and the frame. However, the central portion may not be fixed positionally in the Z direction. The base board preferably has a surface with an area capable of including the entire body of the supporting frame therein. Preferable examples of the configuration of the base board viewed from the direction orthogonal to the surface of the base board include a circle, ellipse, tetragon such as square and rectangle, and right hexagon. The configuration and size of the base board viewed from the direction orthogonal to the surface of the base board are preferably the same as the configuration and size of the reflective section and the frame viewed from the direction orthogonal to the respective surfaces. The base board may be configured with a single plate or a laminated structure composed of a plurality of plates different in material. Further, the inside of the base board may include a honeycomb structure or a lattice frame in order to reduce weight, and the surface of the base board may be covered with a thin plate. Further, the base board may be constituted by a combination of thin long beam members. Examples of the materials of the base board include titanium, iron, steel, stainless steel, FRP, copper, brass or bronze, aluminum, and glass. The above materials may be used solely or as a composite material. In the case where the above materials are used as a composite material, these materials are shaped in a plate member, and the plate members are used to sandwich a hollow structure such as a honeycomb structure, which is preferable, because weight reduction can be advanced. The honeycomb structure can be formed by fabricating aluminum, resin, paper, and so on. Specific examples of the base boards includes a base board in which a honeycomb structure is sandwiched between two aluminum alloy plates; a base board in which a foaming layer is sandwiched between two aluminum alloy plates; a base board in which a honeycomb structure is sandwiched between two FRP boards; a base board in which a honeycomb structure is sandwiched an aluminum alloy plate and a FRP board; and a base board in which a honeycomb structure is sandwiched between two stainless steel plates.

The "supporting structural member" is disposed between the base board and the frame on which the reflective section is disposed, and, for example, is configured to come in contact, via three contact points or a ring-shaped contact line, with the peripheral portion of the frame. The supporting structural member is preferably fixed to the base board. Further, the supporting structural member is preferably to regulate the height of the reflective section and the frame in the Z direction without fixing them. Preferable examples of the configuration of the supporting structural member include a circular ring shape, a rectangle ring shape, three or more multiple convex portions, and the like. In the case of the multiple convex portions, a distance between a pair of neighboring convex portions of them is preferably made equal to a distance between another pair of neighboring convex portions of them. Further, each portion of the supporting structural member has the same height from the base board In particular, it is desirable that when the configuration of the supporting structural member is viewed from the Z direction, the supporting structural member is configured such that each portion of the supporting structural member is arranged with an equal distance from the central portion of the frame serving as a center. With such a configuration of the supporting structural member, when the relative position in the Z direction between the central portion and the peripheral portion is changed, a good-looking concave curved surface with less distortion can be formed, which is desirable, because the light collecting efficiency can be improved. More preferably, when the supporting structural member is viewed from the Z direction, as shown in FIG. 5, the configuration of the supporting structural member is shaped in the form of a ring with its center located at the central portion of the frame. Therefore, the most preferable supporting structural member is a ring arranged on the peripheral portion on the base board, and each portion on the ring has the same height from the base board and is arranged in a circle with an equal distance from the central portion. The supporting structural member is preferably the inscribed circle of the reflective section, the frame or the base board.

Further, a ring-shaped, such as circular ring-shaped and rectangle ring-shaped, supporting structural member may have various cross-sectional configurations as the cross-sectional configuration in the Z direction. For example, cross-sectional configurations shown in FIGS. 2(a) to 2(q) may be formed uniformly in the ring direction (circumferential direction) of the supporting structural member. In particular, the supporting structural member preferably comes in point contact with the frame in order to allow the reflective section and the frame to move easily so as to prevent the deformation of the peripheral portion of the reflective section. Therefore, from the above viewpoints, preferably, the cross section of the supporting structural member is shaped into one of FIGS. 2(a) to 2(g) and 2(l) to 2(o). Particularly preferably, the cross section is shaped so as to include at least a part of a circle or an ellipse on its upper portion (FIGS. 2(a), 2(b), 2(c), 2(e), 2(l), and 2(m)). The supporting structural member preferably has a certain amount of rigidity. For example, the supporting structural member preferably has a Young's modulus being two times or more that of each of the reflective section and the frame. Examples of the materials of the supporting structural member include titanium, iron, steel, stainless steel, FRP, copper, brass or bronze, aluminum, glass, rubber, silicon, Teflon (registered trademark), and resin. The surface of the supporting structural member is preferably shaped in a slippery configuration or made from a slippery material.

It is desirable that a space including the supporting structural member, the base board, and the frame is not sealed up and has breathability. If the space is sealed up, there is a possibility that the reflective section and the frame may deform due to a change of air pressure in the space caused by temperature change at the outside. Accordingly, if the space has breathability, even when the solar light collecting mirror is installed at a place where temperature changes violently as with a desert, the reflective section and the frame may not deform due to a change of air pressure, which is desirable.

Further, the relative position in the Z direction between the central portion and the peripheral portion may be changed by making the height in the Z direction of the supporting structural member changeable.

One of the "solar thermal power generation systems" includes at least one heat collecting section and at least one solar light collecting mirror for reflecting solar light and irradiating the heat collecting section with the reflected solar light, and for example, is configured to heat a liquid with the heat collected by the heat collecting section and to rotate a turbine, thereby generating electric power. It is desirable that a plurality of solar light collecting mirrors is disposed around the heat collecting section. Preferably, as shown in FIG. 3, the plurality of solar light collecting mirrors is arranged in the form of concentric circles or concentric fans. Further, it is desirable that the relative position, in the Z direction, between the central portion of the reflective section or the frame and peripheral portion is made different in accordance with the corresponding one of the respective distances from the heat collecting section to the plurality of solar light collecting mirrors.

In such a system in which that among the respective distances from the heat collecting section to the solar light collecting mirrors, the shortest distance is 10 m or more, the effects of the solar light collecting mirror of the present invention which does not lower the light collecting efficiency while enabling the use of a lightweight film mirror, becomes remarkable. In particular, in solar thermal power generation systems of a tower type (a beam down type, a tower top type, etc.), the present invention can be used preferably.

A plurality of rectangle-shaped or hexagon-shaped solar light collecting mirrors may be arranged to neighbor on each other and combined so as to form a large pseudo concave mirror. Preferably, right hexagonal-shaped solar light collecting mirrors are combined so as to form a honeycomb structure. Each of the plurality of solar light collecting mirrors can be made into a concave mirror with an optional curvature, whereby the light collecting efficiency can be improved greatly.

Advantageous Effects of Invention

According to the present invention, even in a solar thermal power generation system in which a distance from a reflective mirror to a heat collecting device becomes a long distance from some tens of meters to some hundreds of meters as with a tower type solar thermal power generation system, the following effects can be attained. That is, it is possible to provide a solar light collecting mirror which can obtain high light collecting efficiency, can be produced easily at low cost, and can be made in a concave mirror with various curvatures, and it is also possible to provide a solar thermal power generation system employing the solar light collecting mirror.

BRIEF DESCRIPTION OF DRAWINGS

FIG. 9(a) is a top view of the base board, FIG. 9(b) is a view looked from an arrowed direction B in FIG. 9, and FIG. 9(c) is a view looked from an arrowed direction C in FIG. 9.

FIG. 10(a) is an illustration showing a situation that dust adheres in the case where the surface layer of a film mirror is thick, and FIG. 10(b) is an illustration showing a situation that dust adheres in the case where the surface layer of a film mirror is thin.

DESCRIPTION OF EMBODIMENTS

Figure 3:
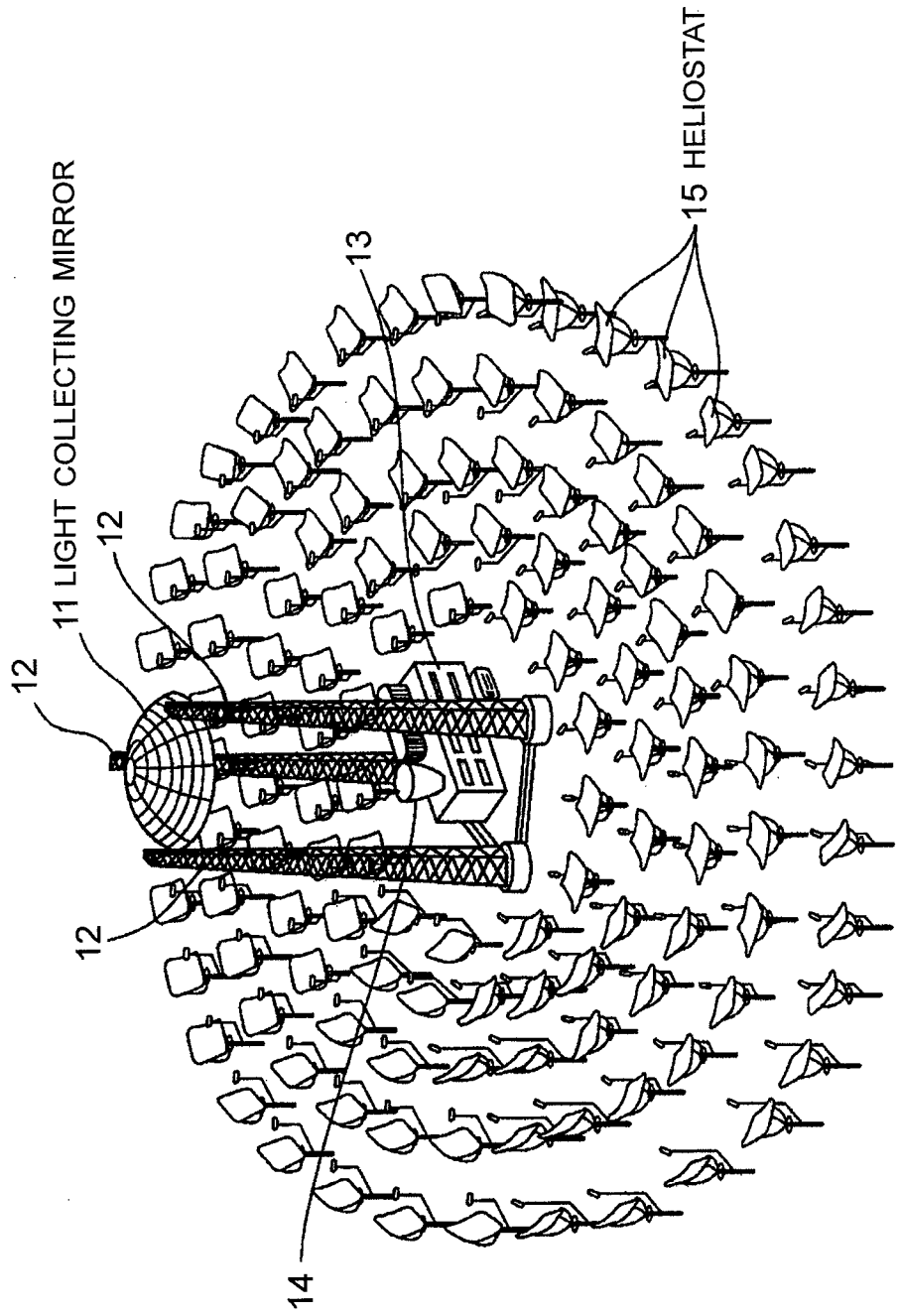
FIG. 3 is a perspective view of a solar thermal power generation system employing solar light collecting mirrors pertaining to the present invention.
Figure 4:
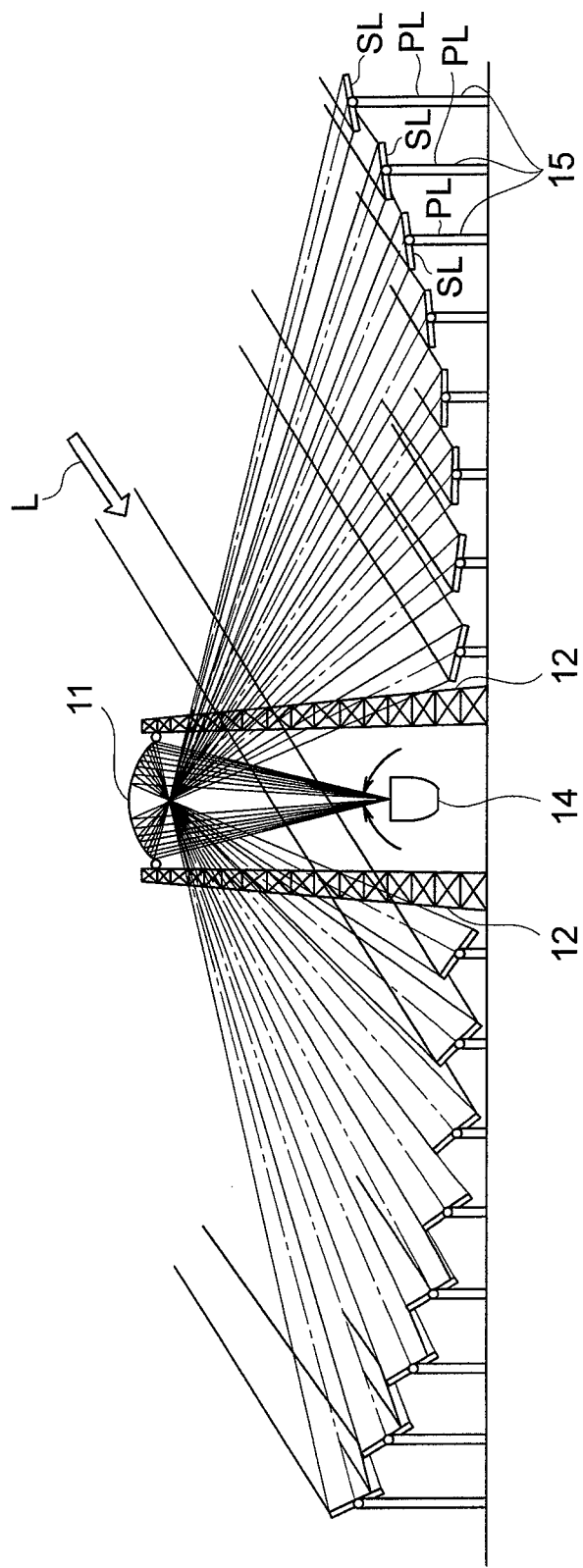
FIG. 4 is a side view of the solar thermal power generation system viewed from its side.

Hereafter, with reference to drawings, the embodiment of the present invention will be described more in detail. FIG. 3 is a perspective view of a solar thermal power generation system employing solar light collecting mirrors according to the present invention. FIG. 4 is a side view of the solar thermal power generation system viewed from its side. In here, although a beam down type solar thermal power generation system is described, the present invention is also applicable to a tower top type solar thermal power generation system.

In FIG. 3, a light collecting mirror 11 with a comparatively large diameter is assembled such that a plurality of mirrors is arranged and combined along an ellipsoidal configuration, and the light collecting mirror 11 is held at a position with a predetermined height by three support towers 12 in the state that its reflective surface faces downward. Beneath the light collecting mirror 11, a heat exchange facility 13 is constructed, and the heat exchange facility 13 includes a heat collecting section 14 for converting solar light L into heat energy. Further, on the ground around the support towers 12, a large number of heliostats 15 are disposed in the state of surrounding the support towers 12. The light collecting mirror 11 is configured such that light with a maximum entering irradiance of 5 or more $kW/m^2$ enters it.

In FIG. 4, each heliostat 15 includes a pole PL standing on the ground and a solar light collecting mirror SL mounted on the top end of the pole PL. The pole PL is rotatable around its axis via a not-shown actuator, and the solar light collecting mirror SL is able to change an angle of elevation with respect to the pole PL via a not-shown actuator. Incidentally, the solar light collecting mirror SL located nearest to the heat exchanger has a distance of 10 m or more in optical path length to the heat exchanger.

Figure 1:
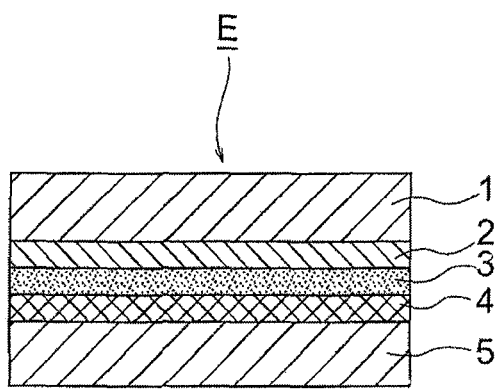
FIG. 1 is an illustration showing a structure of a film mirror E.
Figure 2:
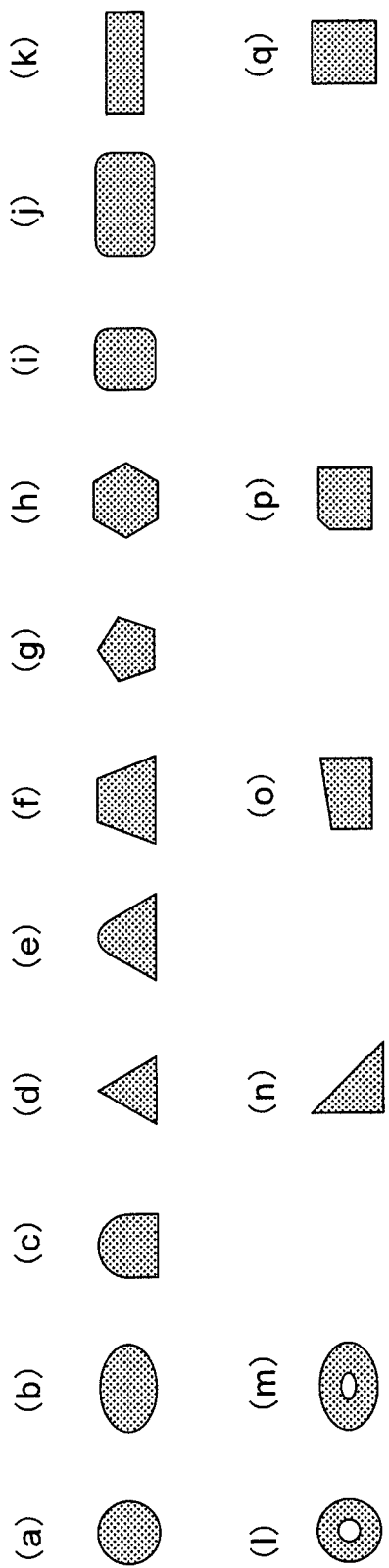
FIGS. 2(a) to 2(q) are illustrations showing various cross sectional configurations 2(a) to 2(q) of a supporting structural member.
Figure 5:
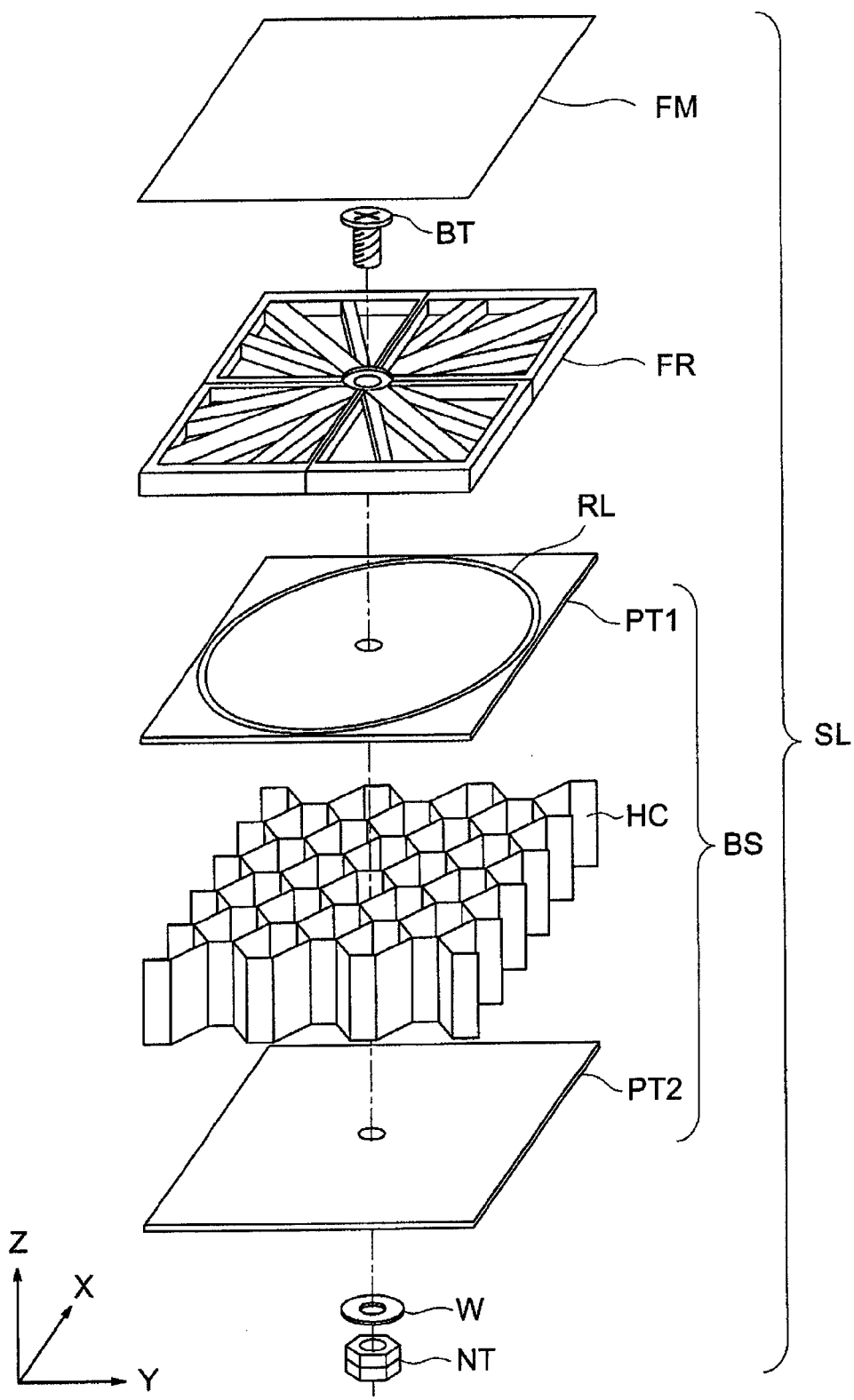
FIG. 5 is an exploded view of a solar light collecting mirror SL.

FIG. 5 is an exploded view of the solar light collecting mirror SL. The solar light collecting mirror SL includes a film mirror FM acting as a reflective section, a rectangle frame-shaped frame FR, a supporting structural member RL, and a rectangle plate-shaped base board BS. The frame FR is composed of an aluminum member with a top surface on which the film mirror FM is pasted. The supporting structural member RL is composed of Teflon (registered trademark) tube shaped in a ring with a circular cross section (FIG. 2(a)). The ring-shaped supporting structural member RL is made to inscribe in the frame FR, and each portion of the ring-shaped supporting structural member RL is arranged with an equal distance from the center of the frame FR and has an equal height. In the base board BS, an aluminum honeycomb core HC is sandwiched between aluminum alloy plates PT1 and PT2. A bolt BT is inserted into holes formed at the respective centers of the frame FR and the plates PT1 and PT2 from the upper side to a washer W disposed at the lower side, and then the inserted bolt BT is screwed into a nut NT, whereby the frame FR, the supporting structural member RL, and the base board BS are made into a single body. Further, the film mirror FM is disposed on the frame FR so as to cover the head of the bolt BT. That is, the bolt BT does not penetrate through the film mirror FM, and, a part of the bolt BT is not exposed on the surface of the film mirror FM. In order to fix the supporting structural member RL on the base board BS, a ring-shaped groove with the same radius may be formed. Here, the normal direction of the film mirror FM, i.e., the axial direction of the bolt BT is made to a Z direction, and the planar directions of the film mirror FM are made to an X direction and a Y direction.

Figure 6:
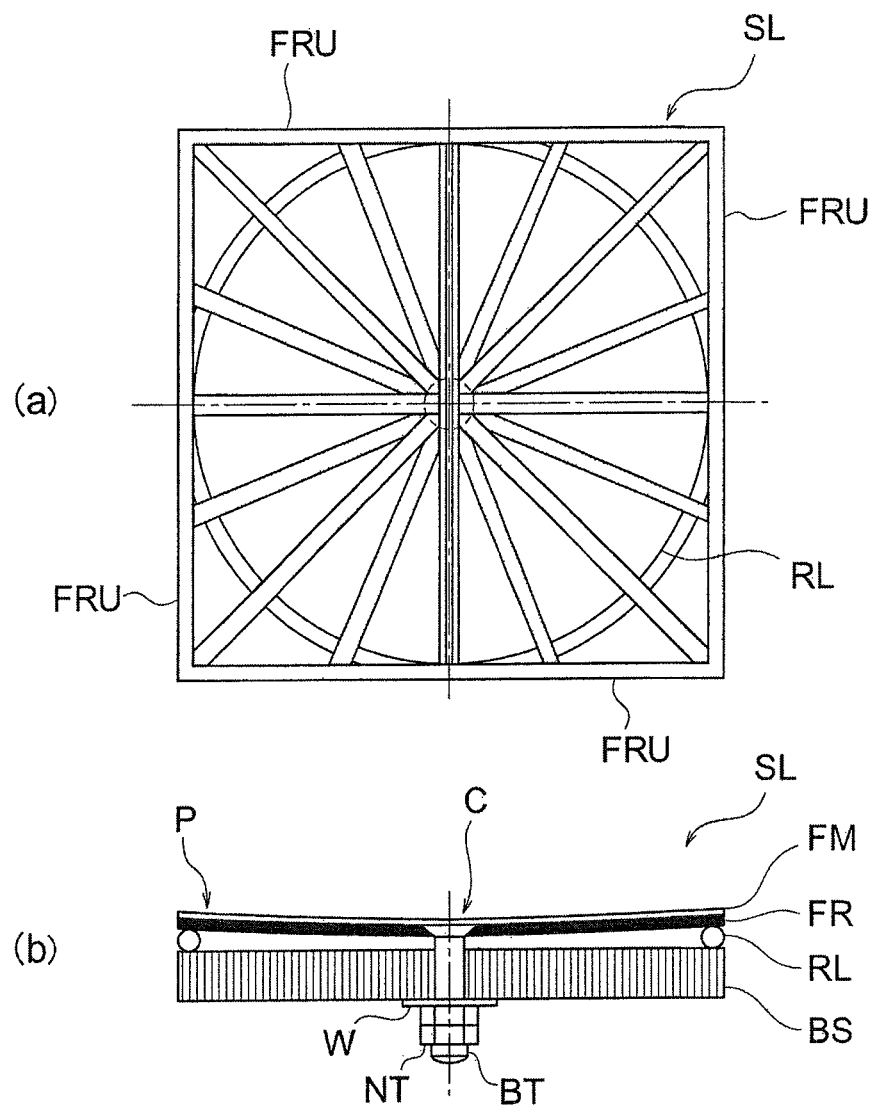
FIG. 6(a) is a top view of a solar light collecting mirror SL in one embodiment.
FIG. 6(b) is a cross sectional view of the solar light collecting mirror SL.
Figure 7:
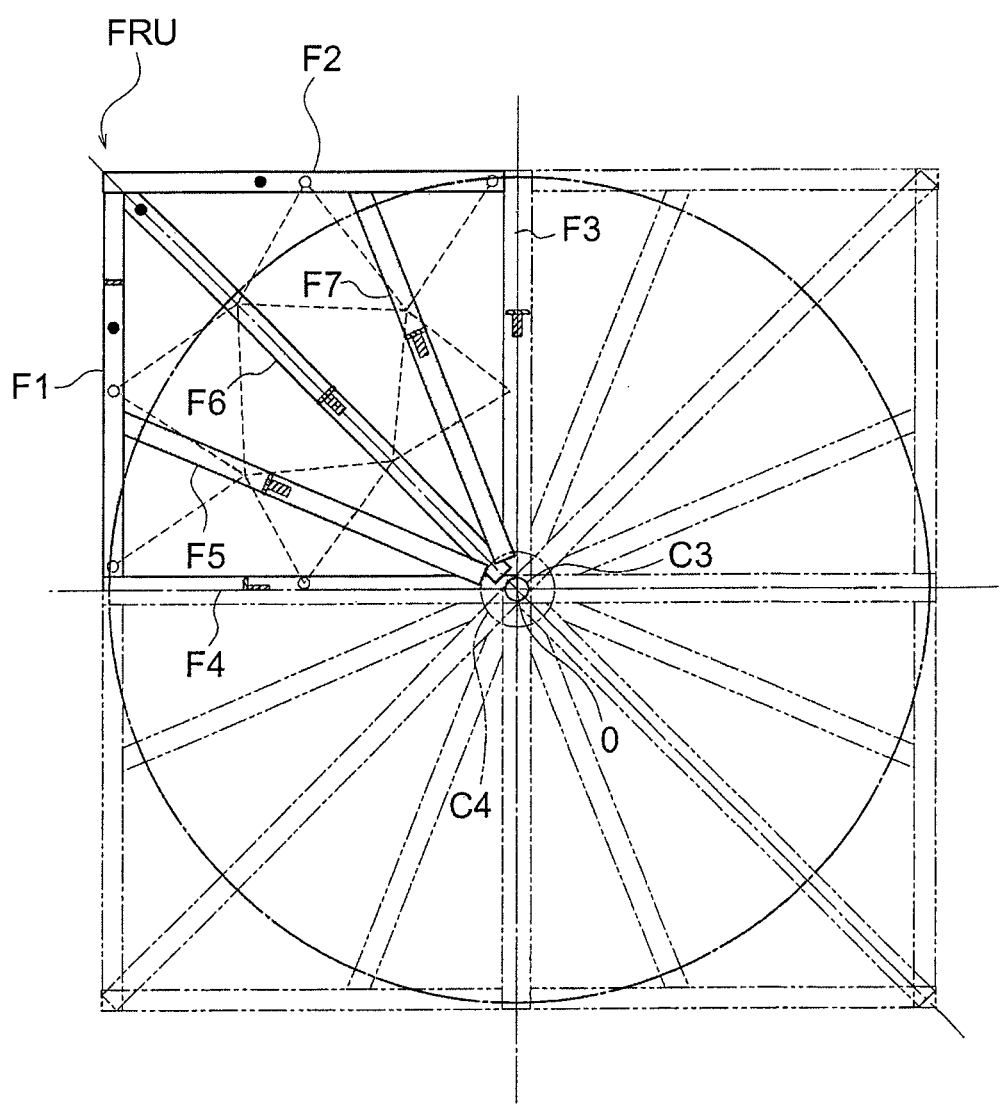
FIG. 7 is a front view of a frame unit FRU.

FIG. 6 (a) is a top view of one example of the solar light collecting mirror SL in a state that the film mirror is removed, and FIG. 6 (b) is a cross sectional view of the one example of the solar light collecting mirror SL. FIG. 7 is a front view of frame units FRU, and a tangent line between the frame units FRU and the supporting structural member RL is shown with a dashed-one dotted line. Here, the outer shape of the film mirror FM is made to conform to that of the frame FR. The frame FR shown in FIG. 6 is constituted by a combination of four frame units FRU which are fastened via not-shown bolts and the like. Each frame unit FRU is formed by square bar members made from aluminum, and is constituted by a combination of a first outer frame member F1, a second outer frame member F2, a third outer frame member F3, and a fourth outer frame member F4 which are arranged in the form of a square. At an intersecting portion between the third outer frame member F3 and the fourth outer frame member F4, chamfered portions C3 and C4 are provided to the third outer frame member F3 and a fourth outer frame member F4 respectively in order to avoid the interference with the bolt. In the state that the frame FR is assembled, an approximately cylinder surface is formed by the chamfered portions C3 and C4 so as to allow the bolt to be inserted therethrough.

In the inside of a region surrounded by the first outer frame member F1 to the fourth outer frame member F4, a first warp member F5, a second warp member F6, and a third warp member F7 are disposed, and they are arranged to extend from an intersecting portion (becoming the central portion O of the frame FR) between the third outer frame member F3 and the fourth outer frame member F4 with a relative angle of 22.5° to each other of a pair of neighboring warp members. That is, in the state that the four frame units FRU are combined so as to form the frame FR, as shown with dotted lines in FIG. 7, the first warp member F5, the second warp member F6, and the third warp member F7 extend radially from the central portion O of the frame FR. Here, the third outer frame member F3 and the fourth outer frame member F4 of each frame unit FRU may also be called a warp member. It is preferable that each of the third outer frame member F3 and the fourth outer frame member F4 has the same thickness, in the Z direction, of that of each of the first outer frame member F1, the second outer frame member F2, and the warp members F5 to F7 and has a half thickness, in the direction orthogonal to it, of it, because an amount of a deformation becomes close to the evenness. The respective members may be welded or fastened with not-shown bolts to each other. However, it is preferable that each of the obverse surface and reverse surface of the frame FR is made into a same-level or continuous surface (the height is constant). In an example shown in FIGS. 6 and 7, on side of the frame unit FRU has a length of 1 m, and one side (the diameter of an inscribed circle inscribed in the frame) of the frame FR has a length of 2 m. In this example, in order to prevent the weight of the frame from becoming too heavy while securing sufficient strength, sixteen (8 and 2=16) warp members are provided.

As shown in FIG. 6(b), if the nut NT is screwed up, the frame FR on which the film mirror FM is fixed causes elastic deformation due to an axial force working on the bolt BT so that the central portion C of the film mirror FM is moved so as to come near in the Z direction to the base board BS. On the other hand, although the peripheral portion P of the frame FR on which the film mirror FM is fixed is regulated in the Z direction by the supporting structural member RL, the peripheral portion P is not regulated and not fixed in the X direction and the Y direction. Accordingly, the peripheral portion P slides on the supporting structural member RL in association with the displacement of the central portion C, which leads to that the peripheral portion P causes relative displacement. At this time, an amount of deflection of each portion of the frame FR at a position located radially with an equal distance from the central portion of the frame FR becomes equal to each other. Accordingly, with this, it becomes possible to form a concave mirror with an approximately paraboloidal surface.

Here, depending on an amount of relative rotation between the nut NT and the bolt BT and a screw lead between them, an amount of the displacement of the central portion C is determined. Accordingly, setting such an amount of relative rotation to a prescribed value enables the formation of a concave mirror with an optional curvature. Namely, in the solar light collecting mirror SL of a heliostat 15 located near the light collecting mirror 11, by making an amount of relative rotation between the nut NT and the bolt BT large, the curvature of the concave mirror can be made comparatively large. On the other hand, in the solar light collecting mirror SL of a heliostat 15 located far from the light collecting mirror 11, by making an amount of relative rotation between the nut NT and the bolt BT small, the curvature of the concave mirror can be made comparatively small. As a result, in total, it becomes possible to realize a solar thermal power generation system with good light collection efficiency.

Figure 8:
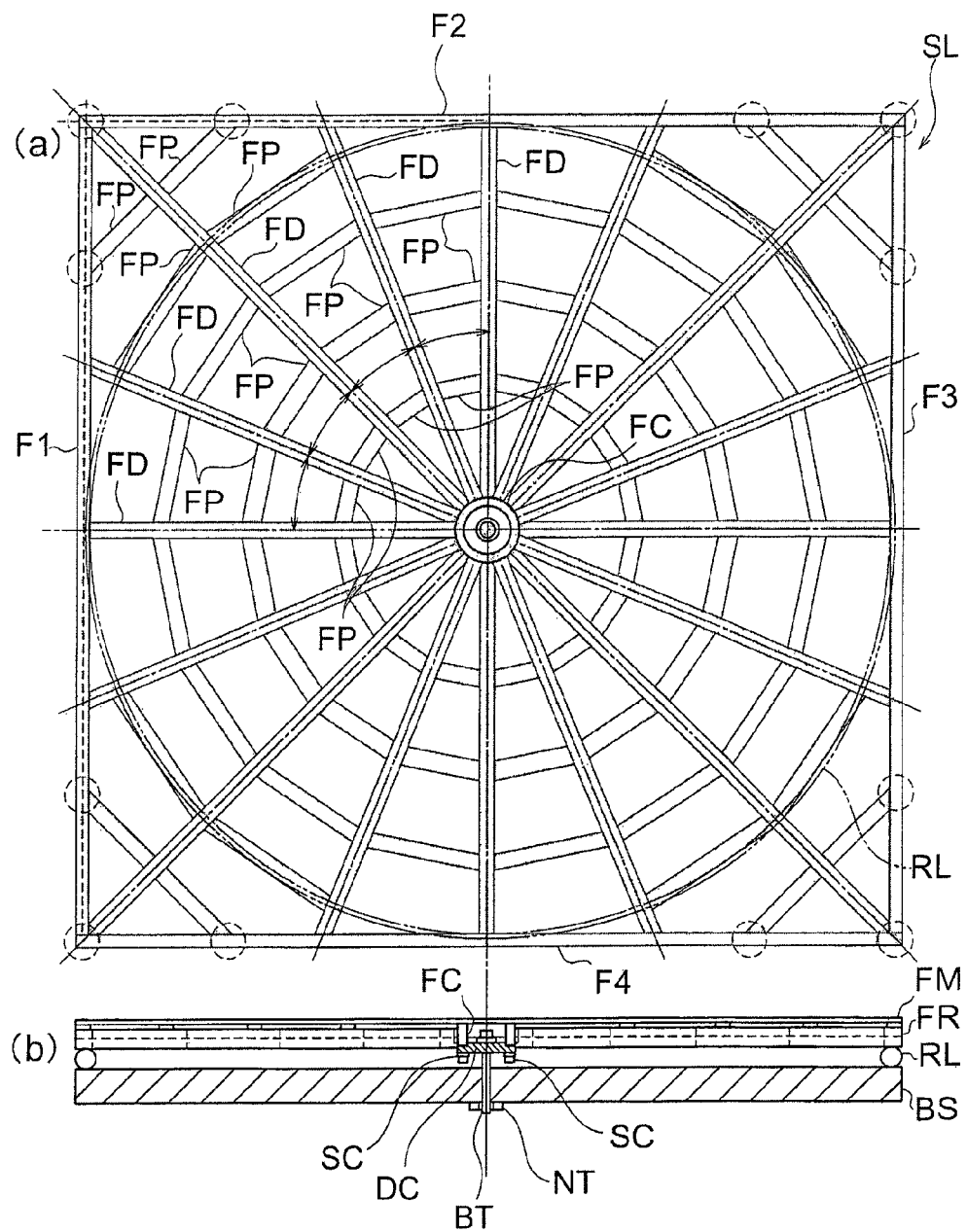
FIG. 8(a) is a top view of a solar light collecting mirror SL in another embodiment.
FIG. 8(b) is a cross sectional view.

FIG. 8(a) is a top view similar to FIG. 6(a) and shows a solar light collecting mirror according to another embodiment, and FIG. 8(b) is a cross sectional view similar to FIG. 6(b) and shows the solar light collecting mirror according to another embodiment. Since the solar light collecting mirror shown in FIG. 6 is a mirror with a size of about 2 m×2 m, a sufficient strength can be secured only with the warp members. However, in order to increase the strength more, as shown in FIG. 8, the strength is secured by providing woof members in addition to the warp members.

In more concrete terms, an integrally-formed frame FR shown in FIG. 8 is constituted by a combination of the first outer frame member F1, the second outer frame member F2, the third outer frame member F3, and the fourth outer frame member F4 which are arranged in a square shape. Further, a cylinder portion FC is disposed at the central portion of the frame FR, and sixteen warp members FD extend radially with an equal gap between a pair of neighboring warp members from the cylinder portion FC toward the outer frame members and are fixed at their respective both ends. Further, woof members FP are arranged in the form of concentric circles around the cylinder portion FC serving as a center and fixed so as to connect neighboring warp members FD. It is preferable that a gap between a pair of neighboring woof members FP is equal to that between another pair of neighboring woof members FP. With this, the frame FR is constituted by a combination of members arranged in the form of a cobweb, whereby the frame FR has a high rigid structure. Here, at least a part of the woof members FP are arranged at positions where the part of woof members FP overlap on the supporting structural member RL in the Z direction, that is, it is preferable that the part of woof members FP are arranged so as to support the supporting structural member RL. The bolt BT is inserted through a hole of a disc DC fixed to the end face of the cylinder portion FC. The other constitutions are similar to those in the above embodiment.

For example, on a site, in the case where it is difficult to adjust finely an amount of relative rotation between a nut NT and a bolt BT, a plurality of discs DC different in thickness are prepared beforehand. Then, on the site, a disc DC with a height matching with a desired curvature of a film mirror is mounted on the cylinder portion FC of the frame FR with small screws SC. With the utilization the fact that the position of the head of the small screw SC changes depending on the thickness of the disc DC, the nut NT and the bolt BT are relatively rotated until the head of the small screw SC comes in contact with the base board BS, whereby the curvature adjustment of the film mirror FM can be performed simply. Namely, the disc DC and the small screw are provided with a function of a spacer. Further, depending on the area of the reflective portion and the frame, if the central portion is fixed with a single point, there is a possibility that only the central portion is rapidly curved. Accordingly, in order to make a portion of each of the reflective portion and the frame in the vicinity of the central portion curve moderately, the small screws SC may be disposed separately from each other so as to be provided with a span to some extent when viewed from the Z direction. In the embodiment shown in FIG. 6, the similar spacer may be disposed.

Here, the deformation of the reflective portion and the frame is achieved not only by a mechanical urging force, such as bolt, but also may be achieved by, for example, a magnet force such as a magnet.

Figure 9:
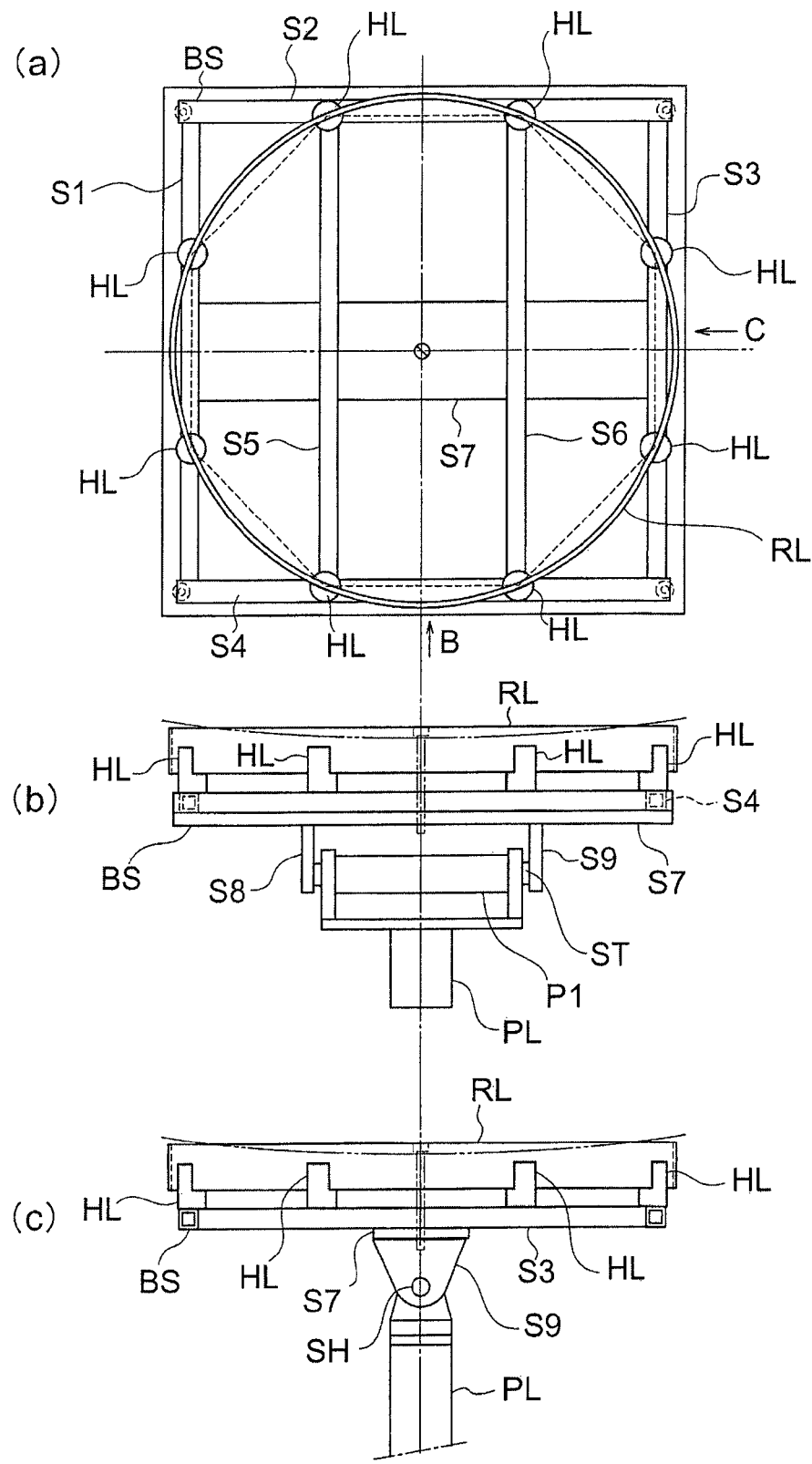
FIGS. 9(a) to 9(c) are illustrations sowing a base board of a solar light collecting mirror SL in still another embodiment.

FIGS. 9(a) to 9(c) are illustrations showing the base board of still another solar light collecting mirror, and FIG. 9(a) is a top view of the base board, FIG. 9(b) is a view looked from an arrowed direction B of FIG. 9(a), and FIG. 9(c) is a view looked from an arrowed direction C of FIG. 9(a). As shown in FIGS. 9(a) to 9(c), the base board BS should not be limited to a form of a plate, and the base board BS may be a combination of a plate material, a beam, and the like. In FIGS. 9(a) to 9(c), the base board BS is constituted in a square form by a combination of a first frame member S1, a second frame member S2, a third frame member S1, and a fourth frame member S4, in which the second frame member S2 and the fourth frame member S4 are connected via two beam members S5 and S6. On the lower surface of the base board BS, a transverse plate member S7 is arranged, and one pair of arm members S8 and S9 are extended from the lower surface of the transverse plate member S7.

On the other hand, on the upper end of a column portion PL of a heliostat, a hollow axle supporting section P1 is disposed. Further, the axle supporting section P1 is arranged so as to be pinched and held between the arm members S8 and S9, and a shaft SH is arranged so as to pass from one arm member S8 through the axle supporting section P1 to another arm member S9. With this, the base board BS is enabled to incline for the column portion PL.

On the top surface of the base board BS, eight cylindrical supporting sections HL are disposed, and the supporting structural member RL is disposed at a prescribed position by the supporting sections HL. The supporting structural member RL is a thin plate-shaped steel belt rounded in the form of a ring, and is configured to support the above-mentioned film mirror FM and frame FR so as to enable them to elastically deform.

Here, although the mirror is shaped in a square form, if the distance to a light collecting spot is long, since the shape of the collected light is rounded, reflection efficiency becomes good. Further, if the mirror is shaped in a square form, since an amount of reflected light increases, the square form is more practical. On the other hand, if the mirror is shaped in a circle form, there is a possibility to reduce distortion. Accordingly, it is possible to determine what kind of shape to be adopted in response to an intended use or a high-priority performance The present invention should not be limited to the embodiments described in the specification. From the embodiments and the technical concepts described in the specification, it is obvious for one of ordinary skill in the art that the present invention includes the other embodiments and the modified embodiments. The description and embodiments in the specification are made for an object of exemplification, and the scope of the present invention is clarified by claims mentioned later.

REFERENCE SIGNS LIST

11 Light collecting mirror
12 Support tower
13 Heat exchange facility
14 Heat collecting section
15 Heliostat
BS Base board
BT Bolt
C3, C4 Chamfered portion
DC Disc
F1 First outer frame member
F2 Second outer frame member
F3 Third outer frame member
F4 Fourth outer frame member
F5 First warp member
F6 Second warp member
F7 Third warp member
FC Cylinder portion
FD Warp member
FM Film mirror
FP Woof member
FR Frame
FRU Frame unit
HC Aluminum honeycomb core
HL Supporting member
L Solar light
NT Nut
P Peripheral portion
PL Pole
PT1, PT2 Aluminum alloy plate
RL Supporting structural member
S1 First frame member
S2 Second frame member
S3 Third frame member
S4 Fourth frame member
S5, S6 Beam member
S7 Transverse plate member
S8, S9 Arm member
SC Small screw
SH Shaft
SL Solar light collecting mirror
ST Base board
W Washer

The invention claimed is:

1. A solar light collecting mirror, comprising a reflective section which is elastically deformable, and a frame which is elastically deformable and configured to support the reflective section,
    wherein a central portion of the reflective section is positionally fixed in an X direction and a Y direction of the reflective section,
    a relative position in a Z direction between the central portion of the reflective section and a peripheral portion of the reflective section is changeable,
    the peripheral portion of the reflective section is not positionally fixed in the X direction and the Y direction,
    the frame includes warp members which radially extend from a position corresponding to the central portion of the reflective section, and
    the reflective section is configured to deform elastically together with the frame so as to change the relative position in the Z direction between the central portion and the peripheral portion, whereby a concave mirror structure is obtained.

2. The solar light collecting mirror described in claim 1, wherein the reflective section is directly disposed on the frame.

3. The solar light collecting mirror described in claim 1, wherein the reflective section is disposed on the frame via a thin plate.

4. The solar light collecting mirror described claim 1, wherein the frame is formed by a combination of a plurality of frame units.

5. The solar light collecting mirror described claim 1, wherein the frame includes woof members which connect the warp members to each other.

6. The solar light collecting mirror described in claim 5, wherein the woof members are arranged in the form of approximately concentric circles around the central portion of the reflective section.

7. The solar light collecting mirror described claim 1, wherein on the supposition that the number of warp members extending radially from the position corresponding to the central portion is n (pieces) and the radius of the frame is L (m), the following conditional expression is satisfied.

$$6 \cdot L \leq n \leq 10 \cdot L \quad (1).$$

8. The solar light collecting mirror described claim 1, wherein when the frame elastically deforms, an amount of deflection of each portion of the frame at a position located radially at an equal distance from the central portion of the reflective section is equal to each other.

9. The solar light collecting mirror described in claim 1, wherein the solar light collecting mirror further includes a base board and a supporting structural member which is disposed between the base board and the frame, and is configured to contact, via three contact points or a ring-shaped contact line, with a peripheral portion of the frame so as to allow the frame to relatively move, and to regulate a height of the frame in the Z direction, wherein a central portion of the frame on which the reflective section is disposed or the supporting structural member is positionally changeable in the Z direction, and wherein by positionally changing the central portion of the frame or the supporting structural member in the Z direction, the peripheral portion of the frame on which the reflective section is formed is moved while in contact with the supporting structural member, whereby the frame on which the reflective section is formed elastically deforms so that a concave mirror structure can be obtained.

10. The solar light collecting mirror described in claim 9, wherein the central portion of the frame on which the reflective section is formed is positionally changeable in the Z direction, wherein by positionally changing the central portion in the Z direction, the peripheral portion of the frame on which the reflective section is formed is moved while in contact with the supporting structural member, whereby the frame on which the reflective section is formed elastically deforms so that a concave mirror structure can be obtained.

11. The solar light collecting mirror described in claim 9, wherein when a configuration of the supporting structural member is viewed from the Z direction, the configuration is shaped such that each portion of the supporting structural member is arranged at an equal distance from the central portion of the frame acting as a center.

12. The solar light collecting mirror described in claim 11, wherein when the configuration of the supporting structural member is viewed from the Z direction, the configuration of the supporting structural member is shaped in a ring with a center positioned at the central portion of the frame.

13. The solar light collecting mirror described in claim 1, wherein the reflective section is a film mirror.

14. The solar light collecting mirror described in claim 1, wherein the reflective section is a thin glass plate mirror.

15. The solar light collecting mirror described in claim 1, wherein the solar light collecting mirror is a mirror for solar thermal power generation.

16. A solar thermal power generation system, comprising at least one heat collecting section and the solar light collecting mirror described in claim 15, wherein the solar light collecting mirror reflects solar light and irradiates the heat collecting section with the reflected solar light.

17. The solar thermal power generation system described in claim 16, wherein a plurality of the solar light collecting mirrors are arranged around the heat collecting section, and the relative position in the Z direction between the central portion of the reflective section and the peripheral portion of the reflective section is set up in accordance with a distance from the heat collecting section to each of the plurality of the solar light collecting mirrors.

18. The solar thermal power generation system described in claim 17, wherein among the respective distances from the heat collecting section to the solar light collecting mirrors, the shortest distance is at least 10 m.

* * * * *